(12) United States Patent
Ono et al.

(10) Patent No.: US 7,982,390 B2
(45) Date of Patent: Jul. 19, 2011

(54) LIGHT EMITTING ELEMENT AND DISPLAY DEVICE HAVING AN INORGANIC PHOSPHOR LAYER

(75) Inventors: Masayuki Ono, Osaka (JP); Kenya Hori, Okayama (JP); Kumio Nago, Nara (JP); Toshiyuki Aoyama, Osaka (JP); Kenji Hasegawa, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 943 days.

(21) Appl. No.: 10/562,794

(22) PCT Filed: Jul. 1, 2004

(86) PCT No.: PCT/JP2004/009677
§ 371 (c)(1), (2), (4) Date: Dec. 29, 2005

(87) PCT Pub. No.: WO2005/004547
PCT Pub. Date: Jan. 13, 2005

(65) Prior Publication Data
US 2006/0170336 A1 Aug. 3, 2006

(30) Foreign Application Priority Data

Jul. 2, 2003 (JP) ................................. 2003-190446
Jul. 2, 2003 (JP) ................................. 2003-190449

(51) Int. Cl.
*H01L 51/00* (2006.01)
*H05B 33/14* (2006.01)

(52) U.S. Cl. ....................................... 313/504; 313/506

(58) Field of Classification Search .................. 313/504, 313/506; 428/690, 917
See application file for complete search history.

(56) References Cited

U.S. PATENT DOCUMENTS

| 4,937,150 | A | 6/1990 | Tsukada |
| 6,180,963 | B1 | 1/2001 | Arai |
| 6,515,314 | B1 * | 2/2003 | Duggal et al. ............ 257/184 |
| 6,777,724 | B2 * | 8/2004 | Duggal et al. ............ 257/184 |
| 6,864,629 | B2 | 3/2005 | Miyaguchi et al. |
| 2001/0040232 | A1 * | 11/2001 | Bawendi et al. ....... 252/301.4 R |

(Continued)

FOREIGN PATENT DOCUMENTS

JP 63-66282 A 3/1988

(Continued)

OTHER PUBLICATIONS

Chinese Office Action, with English translation, issued in Chinese Patent Application No. CN 200480018782.6, mailed Apr. 25, 2008.

(Continued)

*Primary Examiner* — Karabi Guharay
(74) *Attorney, Agent, or Firm* — McDermott Will & Emery LLP

(57) ABSTRACT

A phosphor element (10) includes an electron hole injection electrode (2) and an electron injection electrode (8) disposed opposite to each other, an electron hole transport layer (3), a phosphor layer (4), and an electron transport layer (7) stacked in this order from the side of the electron hole injection electrode toward the side of the electron injection electrode. The stacked layers are sandwiched between the electron hole injection electrode and the electron injection electrode, and. The phosphor layer is formed of an inorganic phosphor material (4) in which at least one part of the surface is covered with an organic material (5).

3 Claims, 13 Drawing Sheets

U.S. PATENT DOCUMENTS

| | | | |
|---|---|---|---|
| 2002/0015859 A1* | 2/2002 | Watanabe et al. | 428/690 |
| 2003/0042850 A1* | 3/2003 | Bertram et al. | 313/504 |
| 2003/0164677 A1 | 9/2003 | Miyaguchi et al. | |
| 2004/0036130 A1* | 2/2004 | Lee et al. | 257/409 |
| 2004/0207578 A1* | 10/2004 | Koyama | 345/76 |
| 2004/0214036 A1* | 10/2004 | Bentsen et al. | 428/690 |
| 2004/0246408 A1 | 12/2004 | Ando et al. | |
| 2005/0017260 A1* | 1/2005 | Lee | 257/101 |
| 2006/0176244 A1* | 8/2006 | Hori et al. | 345/45 |
| 2006/0238112 A1* | 10/2006 | Kasama et al. | 313/504 |
| 2009/0001498 A1* | 1/2009 | Wang et al. | 257/461 |

FOREIGN PATENT DOCUMENTS

| | | |
|---|---|---|
| JP | 63-318092 A | 12/1988 |
| JP | 8-306485 A | 11/1996 |
| JP | 11-162641 | 6/1999 |
| JP | 2000-223264 A | 8/2000 |
| JP | 2001-43977 A | 2/2001 |
| JP | 2001-279240 | 10/2001 |
| JP | 2002-299063 | 10/2002 |
| JP | 2003-059665 | 2/2003 |
| JP | 2003-115385 A | 4/2003 |
| WO | WO 03/021694 A2 | 3/2003 |

OTHER PUBLICATIONS

Japanese Office Action issued in Japanese Patent Application No. 2005-511402, mailed Sep. 8, 2009.

* cited by examiner

LIGHT EMITTING ELEMENT AND DISPLAY DEVICE HAVING AN INORGANIC PHOSPHOR LAYER

RELATED APPLICATION

This application is the U.S. National Phase under 35 U.S.C. §371 of International Application No. PCT/JP2004/009677, filed on Jul. 1, 2004, which in turn claims the benefit of Japanese Application No. 2003-190446 filed on Jul. 2, 2003, and Japanese Application No. 2003-190449, filed on Jul. 2, 2003 the disclosures of which Applications are incorporated by reference herein.

BACKGROUND

1. Technical Field

The present invention relates to a phosphor element which can be used as a luminescent display or various kinds of light sources used for communication or illumination, and a display device using the phosphor element.

2. Description of the Related Art

Recently, an electroluminescent (EL) element has been focused on in a flat type of display device. The EL element has characteristics such as a spontaneous illuminant property, excellent visibility, a wide viewing angle, high-speed response and the like. In addition, the EL element which has been developed at present includes an inorganic EL element using an inorganic material as an illuminant and an organic EL element using an organic material as an illuminant.

According to the inorganic EL element in which an inorganic phosphor such as zinc sulfide and the like is the illuminant, collision excitation occurs between the electrons accelerated in a high electric field of $10^6$V/cm and the luminescent center of a fluorescent substance and when it is alleviated, light is emitted. It was found that an element having double insulation structure proposed by INOGUCHI in 1974 had high luminance and long life, and it has been put to practical use as an in-car display and the like.

The inorganic fluorescent substance is provided such that an inorganic material which becomes a luminescent center is doped in a host crystal including an insulator crystal in general. Since the host crystal is chemically stable, the inorganic EL element is highly reliable and has a long life of 30,000 hours or more. However, the electrons are not likely spread in the insulator crystal even when an electric field is applied, and it is charged because the injected electrons are accumulated on the surface. As a result, since the following injected electrons are repelled, highly energized electrons as an excitation source need to collide. Therefore, although the inorganic EL element has high reliability and a long life, it needs a high alternating voltage for driving, so that it cannot be driven in an active matrix using a thin film transistor. Consequently, it is not put to practical use as a display device in a television and the like.

In addition, according to a technique disclosed in Japanese Patent Publication No. 54-8080, emission luminance is improved by doping a transition metal element or a rare-earth element such as Mn, Cr, Tb, Eu, Tm, Yb and the like in a phosphor layer including ZnS mainly but an average luminance is less than 400 cd/m$^2$, which is not sufficient as the display device in television and the like.

Meanwhile, according to the organic EL element in which the organic material is the illuminant, electron holes and electrons injected from electrodes form exciters and light is emitted when they transit to the ground state. A two-layer element in which an electron hole transport layer and an organic phosphor layer are sequentially stacked, which was proposed by Tang etc. in Applied Physics Letters, 51, 1987, P913, can emit light whose luminance is 1,000 cd/m$^2$ or more at a driving voltage of 10V or less. This triggers active research and development for the organic EL element up to now.

The organic EL element which is studied at present in general will be described with reference to FIG. 5. An organic EL element 50 is formed such that a transparent electron hole injection electrode 52, an electron hole transport layer 53, a phosphor layer 56 and an electron injection electrode 58 are sequentially stacked on a transparent substrate 51. In addition, an electron hole injection layer may be provided between the electron hole injection electrode 52 and the electron hole transport layer 53, an electron transport layer may be provided between the phosphor layer 56 and the electron injection electrode 58, an electron hole block layer may be provided between the phosphor layer 56 and the electron transport layer, or an electron injection layer may be provided between the electron transport layer and the electron injection electrode 58.

The electron hole injection electrode includes ITO (indium tin oxide) film and the like which is a transparent conductive film. In order to improve transparency or lower resistivity in the ITO film, it is formed by a sputtering method, an electron beam evaporation method, an ion plating method and the like.

The electron hole transport layer is formed of a diamine derivative used by Tang etc. such as N,N'-bis(3-methylphenyl)-N,N'-diphenylbenzidine (TRD) and the like. The material is excellent in transparency in general and it is almost transparent even when its film thickness is 80 nm.

The phosphor layer is formed of an electron transporting luminescent material such as tris(8-quinolinolato) aluminum (Alq3) and the like so as to be several tens of nm in thickness by vacuum evaporation similar to the report by Tang etc. in general. In order to implement various luminescent colors, a so-called double hetero structure in which the phosphor layer is relatively thin and the electron transport layer is laminated by about 20 nm may be employed.

As the electron injection electrode, alloy of metal having a low work function and a low electron injection barrier and stable metal having a relatively great work function, such as a MgAg alloy or an AlLi alloy proposed by Tang etc., or a laminated electrode of various electron injection layers of LiF and Al and the like is used in many cases.

In addition, an organic EL display device using a low-temperature polysilicon thin film transistor in driving each pixel is described in Journal of the Society for Information Display, vol. 8, No. 2, p93-97.

According to the conventional organic EL element, there is a defect such that a molecular bonding of the organic material which becomes the illuminant is cut because of an impressed electric field or light irradiation and the like under existence of water or oxygen, so that luminescent performance is lowered. Therefore, it cannot be practically used in continuous driving or it does not have good keeping quality. To solve the above problem, as disclosed in Japanese Patent Laid-open Publication No. 2003-59665, a hybrid organic EL element using a high-reliable inorganic material as the illuminant has been proposed.

SUMMARY

In a case where the phosphor element is used as a display device in television and the like, it has to have a life of 30,000 hours at least. In addition, it has to be driven at a low voltage so that active matrix driving can be driven by a thin film transistor. According to the conventional organic EL element, although it can be driven at a low voltage, it does not have a long life because the organic material is used as the illuminant. Meanwhile, according to the conventional inorganic EL element, although it has a long life, it needs a high voltage at the time of driving. In addition, in the case of the hybrid phosphor element conventionally proposed, although the inorganic fluorescent substance can emit light at a DC low voltage, excellent luminescent characteristics and reliability of the inorganic phosphor are not advantageously used. Thus, it is difficult to satisfy high luminance, high reliability and a long life at the same time regardless of the material of the illuminant.

Thus, it is an object of the present invention to provide a phosphor element having high luminance and a long life which can be driven at low voltage, and a display device using the above phosphor element.

A phosphor element according to the present invention includes an electron hole injection electrode and an electron injection electrode disposed opposite to each other, an electron hole transport layer, a phosphor layer, and an electron transport layer stacked in this order from the side of the electron hole injection electrode toward the side of the electron injection electrode. The stacked layers are sandwiched between the electron hole injection electrode and the electron injection electrode. The phosphor layer includes an inorganic phosphor material in which at least one part of the surface is covered with an organic material.

In addition, the phosphor layer may include an inorganic phosphor layer in which at least one part of the surface is covered with an organic material.

In addition, it is preferable that it further includes first and second substrates disposed opposite to each other in which at least one of them is transparent or semi-transparent, and the electron hole injection electrode, the electron hole transport layer, the phosphor layer, the electron transport layer, and the electron injection electrode are sandwiched in this order between the first and second substrates.

Furthermore, it is preferable that the inorganic phosphor layer includes a semiconductor host crystal.

Still furthermore, the organic material may be chemically adsorbed to a surface of the inorganic phosphor layer. In addition, the organic material may be a conductive organic material having an electron hole transporting property and chemically adsorbed to the surface of the inorganic phosphor layer disposed opposite to the electron hole transport layer. In addition, the organic material may be a conductive organic material having an electron transporting property and chemically adsorbed to the surface of the inorganic phosphor layer disposed opposite to the electron transport layer. Still in addition, the conductive organic material having the electron hole transporting property and the conductive organic material having the electron transporting property may be chemically adsorbed to the surface disposed opposite to the electron hole transport layer of the inorganic phosphor layer, or the surface disposed opposite to the electron transport layer of the inorganic phosphor layer.

Furthermore, the phosphor layer may include an inorganic phosphor particle in which at least one part of the surface is covered with an organic material.

Still furthermore, it is preferable that first and second substrates disposed opposite to each other in which at least one of them is transparent or semi-transparent are further provided and the electron hole injection electrode, the electron hole transport layer, the phosphor layer, the electron transport layer, and the electron injection electrode are sandwiched in this order between the first and second substrates.

Still furthermore, it is preferable that the inorganic phosphor particle is a fluorescent substance including a semiconductor host crystal. In addition, it is preferable that the semiconductor host crystal includes an oxide or a composite oxide including at least one kind of element selected from a group of Zn, Ga, In, Sn and Ti.

Still furthermore, the organic material may be provided on at least one part of the surface of the inorganic phosphor particle by chemical adsorption. In addition, the organic material may be a conductive organic material having an electron hole transporting property and an electron transporting property. In addition, the organic material may include a conductive organic material having an electron hole transporting property and a conductive organic material having an electron transporting property.

Still furthermore, an electron hole injection layer sandwiched between the electron hole injection electrode and the electron hole transport layer may be further provided. In addition, an electron injection layer sandwiched between the electron injection electrode and the electron transport layer may be provided. In addition, an electron hole block layer sandwiched between the phosphor layer and the electron transport layer may be provided.

Still furthermore, a thin film transistor connected to the electron hole injection electrode or the electron injection electrode may be provided. In addition, the thin film transistor may be an organic thin film transistor including a thin film formed of an organic material.

An active matrix display device according to the present invention includes a phosphor element array in which the plurality of phosphor elements are arranged two dimensionally, a plurality of x electrodes extending parallel to each other in a first direction parallel to a surface of the phosphor element array, and a plurality of y electrodes extending parallel to each other in a second direction which is parallel to a surface of the phosphor element array and perpendicular to the first direction. The thin film transistor of the phosphor element array is connected to the x electrode and the y electrode.

As described above, according to the phosphor element having the above constitution of the present invention, the inorganic phosphor material including a low-resistant host crystal, in which a conductive organic material is adsorbed to at least one part thereof is used as the phosphor layer. Thus, there can be provided the phosphor element which can be driven at a voltage as low as that of the conventional organic EL element, and the phosphor element has a long life and high reliability.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE PREFERRED EMBODIMENTS

Figure 1:
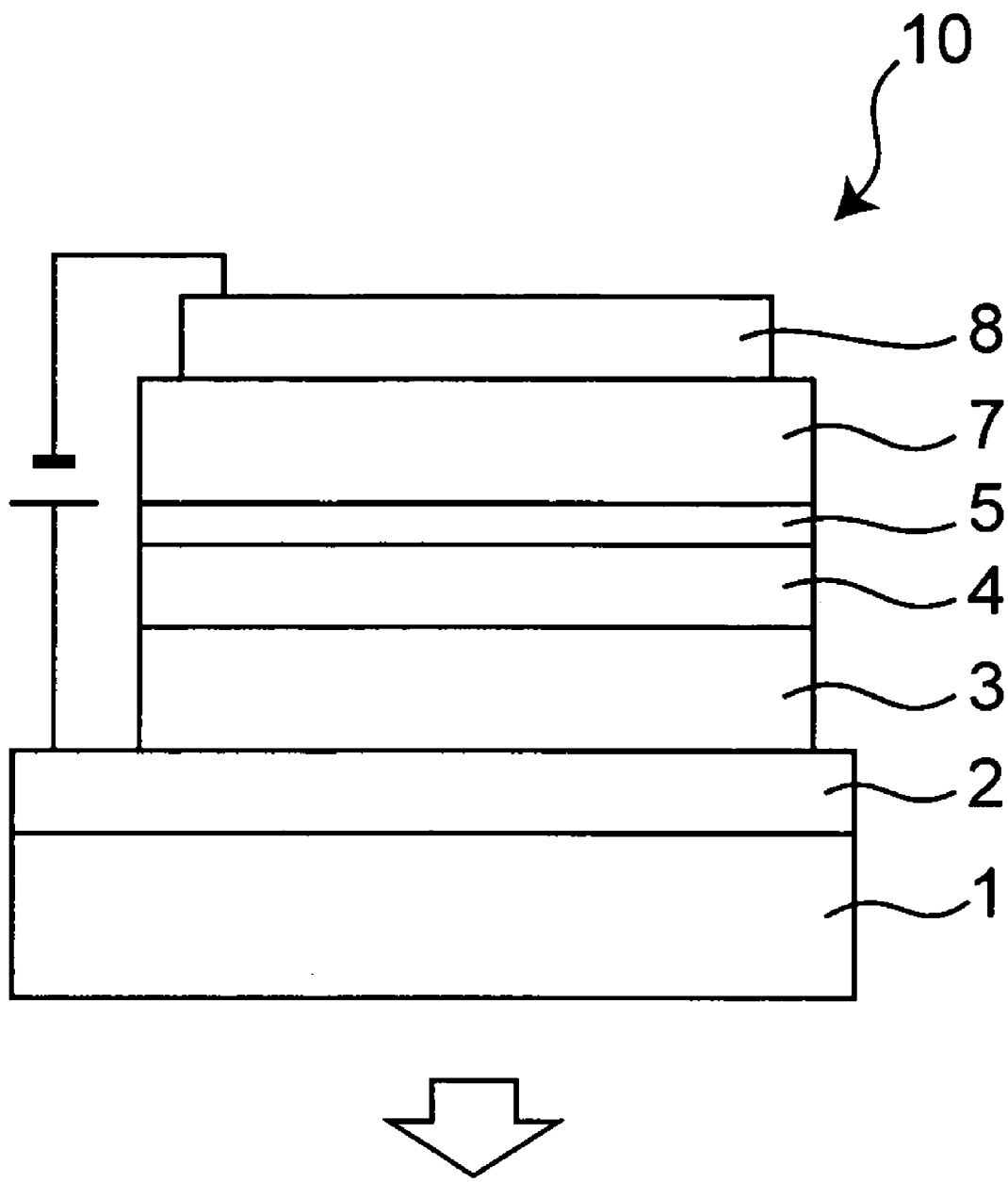
FIG. 1 is a sectional view showing a phosphor element and perpendicular to its emission surface according to a first embodiment of the present invention.

Hereinafter, a phosphor element and a display device using the phosphor element according to embodiments of the present invention will be described with reference to the accompanying drawings. In addition, the same reference numerals are allotted to substantially the same components in the drawings.

First Embodiment

A phosphor element according to a first embodiment of the present invention will be described with reference to FIG. 1. FIG. 1 is a sectional view showing the phosphor element and perpendicular to its light emission surface. In the phosphor element 10, an inorganic phosphor layer 4 is used as an illuminant. The phosphor element 10 includes a transparent substrate 1, an electron hole injection electrode 2 provided on the transparent substrate 1, an electron injection electrode 8 provided so as to be disposed opposite to the electron hole injection electrode 2, and the inorganic phosphor layer 4 sandwiched between the transparent electron hole injection electrode 2 and the electron injection electrode 8 and including an electron transporting organic material 5 chemically adsorbed to its surface. More specifically, the phosphor element 10 includes an electron hole transport layer 3 sandwiched between the electron hole injection electrode 2 and the inorganic phosphor layer 6, and an electron transport layer 7 sandwiched between the inorganic phosphor layer 4 including the electron transporting organic material 5 chemically absorbed adsorbed to the surface and the electron injection electrode 8. In addition, as shown by an arrow in FIG. 1, light is emitted from the side of the substrate 1. Furthermore, addition to the above constitutions, an electron hole injection layer and/or a conductive layer may be provided between the electron hole injection electrode 2 and the electron hole transport layer 3, for example. In addition, an electron hole block layer and/or a conductive layer may be provided between the phosphor layer 6 and the electron transport layer 7, for example. Still furthermore, an electron injection layer and/or a conductive layer may be provided between the electron transport layer 7 and the electron injection electrode 8, for example. In addition, in the phosphor element 10, although a luminescent color emitted from the phosphor element is determined by the inorganic phosphor layer 4, a color conversion layer may be provided ahead of the phosphor direction of the inorganic phosphor layer 4 or a color conversion material may be mixed in the electron hole transport layer 3 in order to display multiple colors, or white color or to adjust color purity of each color. Since the color conversion layer and the color conversion material may only have to emit light as an excitation source, it may be an organic material or an inorganic material, so that a well-known fluorescent substance, a pigment, a dye and the like can be used. For example, when the color conversion layer which emits light in complementary color to that of the light from the inorganic phosphor layer 4 is provided, a surface light source which emits white light can be provided.

Next, each component of the phosphor element 10 will be described in detail. First, a description will be made of the transparent substrate 1. The transparent substrate 1 may only have to support each layer formed thereon. In addition, the transparent substrate 1 may be formed of a transparent or a semi-transparent material so that light generated in the inorganic phosphor layer 4 can be emitted. As the transparent substrate 1, a glass substrate such as Corning 1737 or a resin film formed of polyester or the like may be used. In addition, a non-alkali glass, a ceramics substrate or a silicon substrate may be used so that alkali ion and the like contained in normal glass may not affect the phosphor element. In addition, alumina and the like may be coated on a glass surface as an ion burrier layer. As the resin film, a material having durability, flexibility, transparency, electric insulation and moisture resistance, such as a combination of polyethylene terephthalate series or polychlorotrifluoroethylene series and nylon 6 or fluorocarbon resin material or the like can be used. In addition, when the light is emitted from the surface of the electron injection electrode 8, the transparent substrate 1 is not necessarily transparent.

Next, a description will be made of the electron hole injection electrode 2. As the electron hole injection electrode 2, metal having transparency and high work function is used, and especially ITO (indium tin oxide) film is used. In addition, an oxide such as $SnO_2$ or ZnO, Ni, Au, Pt, Pd, Cr, Mo, W, Ta, Nb and the like or an allow of these can be used. Furthermore, a conductive resin such as polyaniline may be used. The ITO film can be formed by a sputtering method, an electron beam evaporation method, ion plating method and the like in order to improve its transparency or to lower its electric resistivity. In addition, after the film is formed, a surface processing such as plasma processing may be performed in order to control the electric resistivity or the work function. Although a film thickness of the electron hole injection electrode 2 is determined by a required sheet resistance value and visible light transmission coefficient, since a drive current density is relatively high in the phosphor element 10 and a wiring resistance becomes a problem, it is not less than 100 nm to reduce the sheet resistance value in many cases. In addition, when at least one electrode of the electron hole injection electrode 2 and the electron injection electrode 8 is made transparent or semi-transparent, surface emission can be implemented. In addition, when the electron injection electrode 8 is made transparent or semi-transparent, and the electron hole injection electrode 2 is made non-transparent, an upper surface emission type of phosphor element can be provided in the same layer structure. Still furthermore, when both electron hole injection electrode 2 and electron injection electrode 8 are made transparent or semi-transparent, a both-surface emission type of phosphor element can be provided.

Next, a description will be made of the electron hole transport layer 3. As the electron hole transport layer 3, an organic material including an electron hole transporting property is used, which includes two main types such as a low-molecular material and a high-molecular material. The low-molecular material including the electron hole transporting property includes a diamine derivative and especially a two-structure diamine derivative of Q1-G-Q2 disclosed in Japan Patent No. 2037475 used by Tang etc. such as N,N'-bis (3-methylphenyl)-N,N'-diphenylbenzidine (TPD), or N,N'-bis α-naphtyl)-N,N'-diphenylbenzidine (NPD), and the like. In adition, Q1 and Q2 are groups having a nitride atom separately and at least three carbon chains (at least one of them is an aromatic group), and G is a connecting group including a cycloalkylene group, an arylene group, an alkylene group or carbon-carbon connection. As another preferable example, there are an oxadiazole compound, an oxazole compound, a triphenylmethane, a pyrazoline compound, a hydrazone compound, a stilbene compound, a starburst compound and the like. In addition, as the high-molecular material including the electron hole transporting property, there are π-conjugated polymer, or σ-conjugated polymer, and a low-molecular polymer which incorporates a molecular structure showing the electron hole transporting property in a molecular chain, in which an arylamines compound and the like are incorporated. More specifically, it includes a poly-para-phenylene vinylene derivative (PPV derivative), polythiophene derivative (PAT derivative), polyparaphenylene derivative (PPP derivative), polyalkylphenylene (PDAF), a polyacetylene derivative (PA derivative), a polysilane derivative (PS derivative) and the like. Especially, poly-N-vinylcarbazole (PVK) shows high hole mobility such as $10^{-6}$ cm$^2$/Vs. As another example, there are polyethylenedioxythiophene (PEDOT), polystyrenesulfonate (PSS), polymethylphenylsilane (PMPS) and the like.

In addition, a form in which molecules of the low-molecular material including the electron hole transporting property is dispersed in a conductive or non-conductive polymer can be taken. As a concrete example of the molecular dispersion, there is an example in which molecules of tetraphenyldiamine (TPD) are dispersed in polycarbonate in high concentration and its hole mobility is about $10^{-4}$ to $10^{-5}$ cm$^2$Ns. Furthermore, a form in which a p-type semiconductor inorganic material is dispersed in the conductive or non-conductive polymer can be taken.

A method of forming the electron hole transport layer 3 includes a vacuum evaporation method in the case of the low-molecular material, an inkjet method, a dipping method, a spin coat method, and other various methods in the case of the high-molecular material.

Next, a description will be made of the inorganic phosphor layer 4. As a fluorescent substance constituting the inorganic phosphor layer 4, it is preferable that it is not absorbed in a visible light region and has low electric resistance. The fluorescent substance is so constituted that one or more metal elements selected from Mn, Cu, Ti, Ag, Au, Al, Ga, Sn, Pb, Cr, Ce, Pr, Nd, Sm, Eu, Gd, Tb, Dy, Ho, Er, Tm, Yb and the like are added as an activator agent in the center of one or more host crystals including semi-insulating semiconductor in general. In addition, the activator agent may be a fluoride such as TbF$_3$ or PrF$_3$. In addition, non-metal element such as Cl or I may be added together. As the host crystal, there are sulfide, selenide, telluride series, oxide series. Regarding the sulfide, the selenide and the telluride series, there are group XII-XVI compound semiconductors (ZnS, CdS, ZnSe, CdSe, and ZnTe, for example), group II-XVI compound semiconductors (CaS, SrS, CaSe, and SrSe, for example), gallium sulfide (CaGa$_2$S$_4$, SrGa$_2$S$_4$, and BaGa$_2$S$_4$, for example), aluminum sulfide (BaAl$_2$S$_4$, CaAl$_2$S$_4$ and SrAl$_2$S$_4$, for example), mixed crystal of the above compounds semiconductors (ZnMgS, CaSSe, and CaSrS, for example), or mixture which may be partially segregated. Meanwhile, regarding the oxide series, there are metal oxide (ZnO, (Zn, Mg) O, CaO, GeO$_2$, SnO$_2$, Ga$_2$O$_3$, Y$_2$O$_3$, and In$_2$O$_3$, for example), metal composite oxide (Zn$_2$SiO$_4$, Zn$_2$GeO$_4$, ZnGa$_2$O$_4$, CaGa$_2$O$_4$, CaGeO$_3$, CaTiO$_3$, MgGeO$_3$, Y$_4$GeO$_8$, Y$_2$GeO$_5$, Y$_2$Ge$_2$O$_7$, Y$_2$SiO$_5$, BeGa$_2$O$_4$, Sr$_3$Ga$_2$O$_6$, (Zn$_2$SiO$_4$—Zn$_2$GeO$_4$), (Ga$_2$O$_3$—Al$_2$O$_3$), (CaO—Ga$_2$O$_3$), (Y$_2$O$_3$—GeO$_2$), and mixture of these which may be partially segregated. Among them, an especially preferable example having low resistance as the single host crystal is an oxide or a composite oxide containing at least one element selected from a group Zn, Ga, In, Sn and Ti. As respective examples of the fluorescent substance, there are ZnO:Zn (luminescent color is Blue-Green), (Zn, Mg) 0: Zn (Blue), ZnGa$_2$O$_4$:Mn$^{2+}$ (Green), In$_2$O$_3$:Eu$^{3+}$ (Red), SnO$_2$: Eu$^{3+}$ (Red), CaTiO$_3$:Pr$^{3+}$ (Red) and the like. Furthermore, in the case of the host crystal having relatively high resistance such as ZnS, the above host crystal having low resistance such as ZnO or In$_2$O$_3$ may be mixed to lower the resistance. In addition, the activator agent has an appropriate concentration in general, and emission intensity is reduced because of concentration quenching if the concentration becomes higher than a certain level. Because it is thought that excitation energy is transmitted from one direction to the other because of quantum resonance in the center of the emission, so that it reaches a non-emission part.

Next, a description will be made of the electron transporting organic material layer 5 chemically adsorbed to the surface of the inorganic phosphor layer 4. The electron transporting organic material 5 may only have to include the electron transporting property and may be formed of one or more materials. In addition, the electron transporting organic material includes a low-molecular material and a high-molecular material.

The low-molecular material including the electron transporting property includes an oxadiazole derivative, a triazole derivative, a styryl benzene derivative, a silole derivative, 1,10-phenanthroline derivative, a quinolinol series metal complex, a thiophene derivative, a fluorene derivative, a quinone derivative, and the like or their dimer or trimer. More preferably, the following material may be preferably used, that is, 2-(4-biphenyl)-5-(4-tert-butylphenyl)-1,3,4-oxadiazole (PBD); 2,5-biss (1-naphtyl)-1,3,4-oxadiazole (BND); 2,5-bis[1-(3-methoxy)-phenyl]-1,3,4-oxadiazole (BMD); 1,3,5-tris[5-(4-tert-butylphenyl)-1,3,4-oxadiazole-2-yl]benzene (TPOB); 3-(4-biphenyl)-4-phenyl)-5-(4-tert-butylphenyl)-1,2,4-triazole (TAZ); 3-(4-biphenyl)-4-(4-ethylphenyl)-5-(4-tert-butylphenyl)-1,2,4-triazole (p-EtTAZ); 4,7-diphenyl-1,10-phenanthroline (BPhen); 2,9-dimethyl-4,7-diphenyl-1,10-phenanthroline (BCP); 3,5-dimethl-3',5'-di-tert-butyl-4,4'-diphenoquinone (MBDQ); 2,5-bis[2-(5-tert-butylbenzoxazolyl)]-thiophene (BBOT); trynitrofluorenone (TNF); 5,5'-bis(dimesitylboryl)-2,2'bithiophene (BMB-2T); and tris(8-quinolinolato)aluminum (Alq3). In addition, the high-molecular material including the electron transporting property includes poly-[2-methoxy-5-(2-etyhlhexyloxy)-1,4-(1-cyanovinylene)phenylene] (CN-PPV), polyquinoxaline, and a low-molecular polymer incorporating a molecular structure which shows the electron transporting property, in a molecular chain.

Next, a description will be made of a method by which the electron transporting organic material 5 is chemically adsorbed to the surface of the inorganic phosphor layer 4. The chemical adsorption method includes a method in which a carboxyl group (—COOH) is introduced to the electron transporting organic material 5, and it is esterified to a hydroxyl group on the surface of the inorganic phosphor layer 4 and solidified.

Although the esterifying process can be performed by melting or diffusing the electron transporting organic material 5 in a solvent and soaking the inorganic phosphor layer 4 in the solved or diffused liquid, the present invention is not limited to this. Thus, the inorganic phosphor layer 4 on which the electron transporting organic material 5 is adsorbed can be formed. In addition, instead of the carboxyl group, a thiocarboxyl group, (—CSOH), a dithiocarboxyl group (—CSSH), a sulfo group (—$SO_3H$), a sulfino group (—$SO_2H$), a sulfeno group (—SOH), a phosphono group (—$PO(OH)_2$), a phosphine group (—$PH_2O_2$), a mercapto group (—SH), a trimetoxylyl group (—$Si(OCH_3)$), a trichlorosilyl group (—$SiCl_3$), an amid group (—$CONH_2$) and an amino group (—$NH_2$) may be used.

Furthermore, the adsorption may be coordinate bonding between the metal element in the inorganic phosphor layer 4 and an element having a lone electron-pair such as nitrogen, oxygen, sulfur, phosphor and the like of the electron transporting material 5. In addition, after the electron transporting organic material 5 is adsorbed to the surface, a post-processing such as heating, acid or base processing may be performed.

In addition, since the electron transporting organic material 5 is adsorbed to the surface of the inorganic phosphor layer 4, the inorganic phosphor layer 4 can be protected from an influence such as water, so that chemical stability can be improved.

A description will be made of the electron transport layer 7. The electron transport layer 7 is formed of an organic material including an electron transporting property and it may be formed of the same one used in the above electron transporting organic material 5. In addition, a form in which the above low-molecular electron transporting organic material or an n-type conductive inorganic material may be dispersed in a conductive or a non-conductive polymer can be taken.

A method of forming the electron transport layer 7 includes a vacuum evaporation method in the case of the low-molecular material, and an inkjet method, a dipping method, a spin coat method, various kinds of methods in the case of the high-molecular material.

A description will be made of the electron injection electrode 8. The electron injection electrode 8 may be formed of an alloy of alkali metal or alkaline-earth metal in which the work function is small and electron injection barrier is few, and stable metal in which the work function is relatively great such as Al or Ag. The electron injection electrode 8 formed of the alloy is stable and its electron injection is easy. The electron injection electrode 8 may be formed of MgAg, AlLi and the like. Another electron injection electrode 8 includes various kinds of electrodes having a constitution in which a metal thin film having small work function is formed on the side of the organic layer and a metal film formed of stable metal is stacked on the film as a protection electrode, or a constitution in which a thin film of LiF or a $Al_2O_3$ is formed and then an Al film is formed a little thickly, for example. In addition, when the light is emitted from the side of the electron injection electrode 8, it is to be transparent or semi-transparent in addition to the above constitution. For example, the electron injection electrode 8 is formed such that a thin film of MgAg having a thickness of about 10 nm is provided, or InZnO and the like is sputtered to reduce an influence to the lower organic material layer, and then a protection layer is provided thereon.

Next, a description will be made of a mechanism of emission of the phosphor element 10 formed as described above. The electron transporting organic material 5 has a molecular structure in which π electron cloud to transport electrons is largely spread. As describe above, since the electron transporting organic material 5 is chemically adsorbed to the surface of the inorganic phosphor layer 4 and conductivity of the host crystal is high, the spread of the π electron cloud of the electron transporting organic material 5 affects up to the surface of the inorganic phosphor layer 4 and electrons are injected without being hindered by the injection barrier. The following two processes are thought in the course of emission. That is, according to the first process, the electrons injected in the inorganic phosphor layer 4 are moved to the vicinity of the emission center and captured by a donor level and light is emitted when they are recombined to the electron holes injected from the electron hole injection electrode. According to the second process, electron transition of rare-earth ion and the like which is activated by movement of recombination energy in the emission center is generated and the light is emitted when it is alleviated. It is thought that the first and second emission processes are mixed in practice.

Second Embodiment

Figure 2:
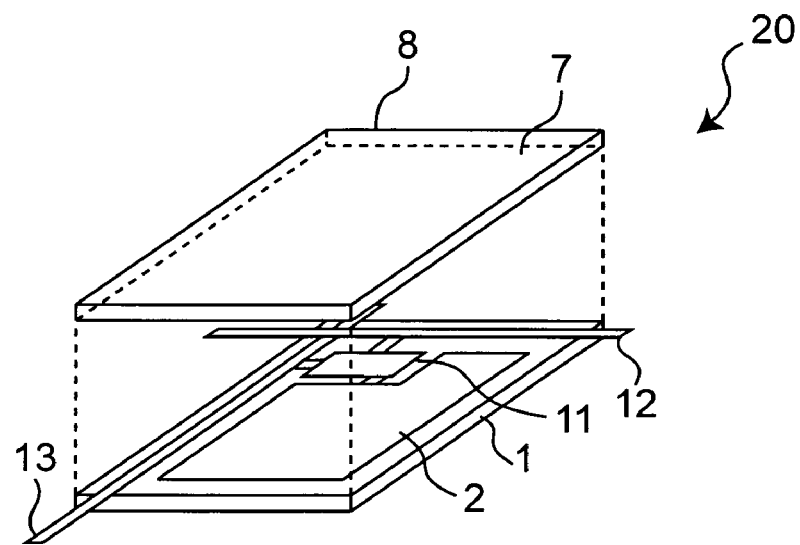
FIG. 2 is a perspective view showing a phosphor element according to a second embodiment of the present invention.

A phosphor element according to a second embodiment of the present invention will be described with reference to FIG. 2. FIG. 2 is a perspective view showing an electrode constitution of the phosphor element 20. The phosphor element 20 further includes a thin film transistor 11 connected to a transparent electron hole injection electrode 2. An x electrode 12 and a y electrode 13 are connected to the thin film transistor 11. In addition, when the thin film transistor 11 is used, the phosphor element 20 can function as a memory. As the thin film transistor 11, a low-temperature polysilicon or an amorphous silicon thin film transistor may be used. In addition, it may be an organic thin film transistor including a thin film formed of an organic material.

Third Embodiment

Figure 3:
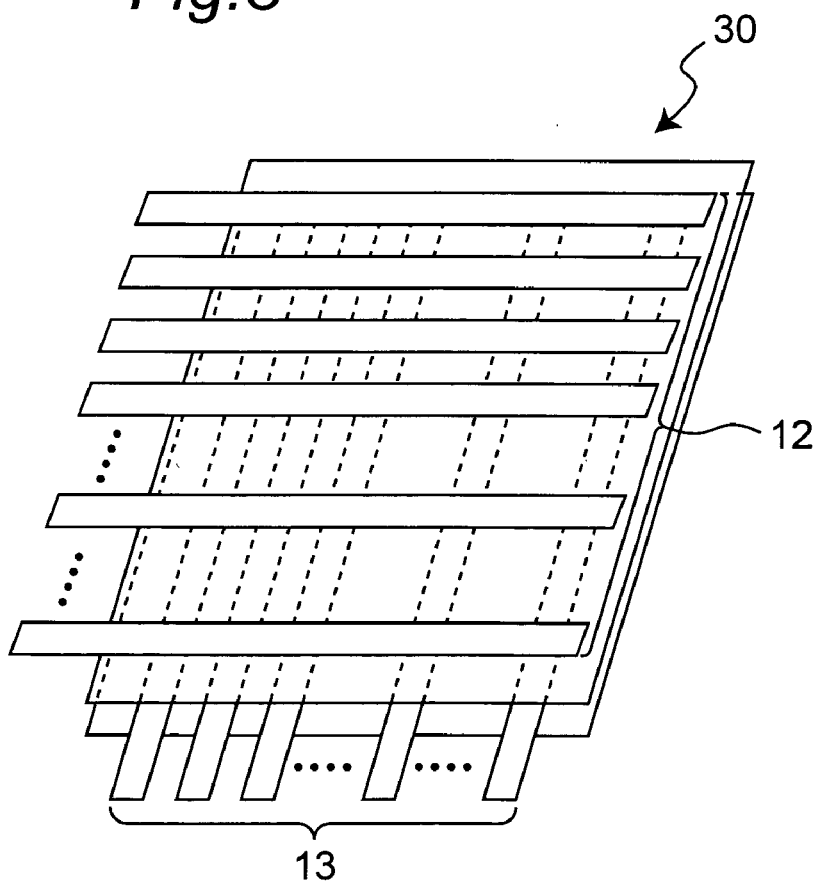
FIG. 3 is a schematic plan view showing a display device using a phosphor element according to a third embodiment of the present invention.
Figure 4:
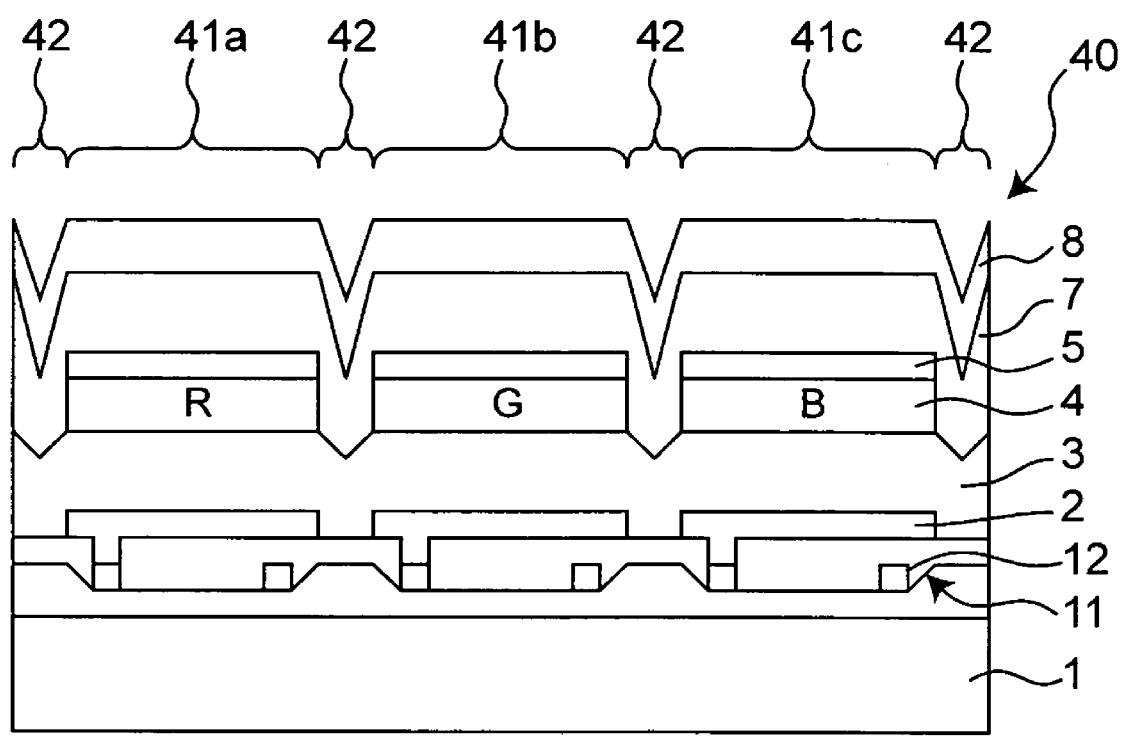
FIG. 4 is a sectional view showing a display device using the phosphor element and perpendicular to its emission surface according to the third embodiment of the present invention.
Figure 5:
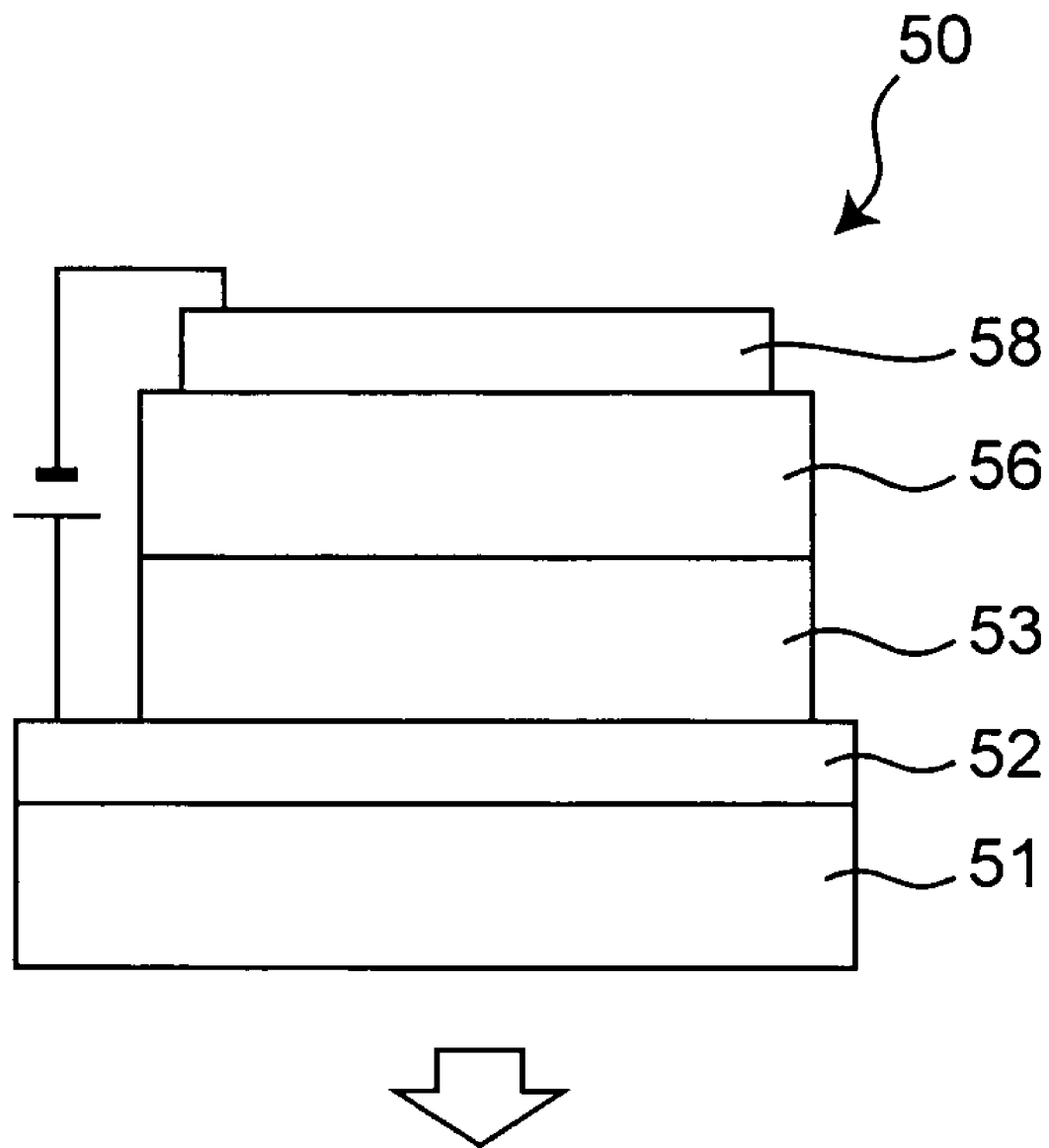
FIG. 5 is a sectional view showing a conventional organic EL element and perpendicular to its emission surface.

A display device according to a third embodiment of the present invention will be described with reference to FIGS. 3 and 4. FIG. 3 is a schematic plan view showing an active matrix including the x electrodes 12 and the y electrodes 13 which intersect to each other in the display device 30. In addition, FIG. 4 is a sectional view showing the display device 30, which is parallel to the electrodes 12 and perpendicular to an emission surface. The display device 30 is an active matrix display device having a thin film transistor 11. The active matrix display device 30 includes a phosphor element array in which the plurality of phosphor elements shown in FIG. 2 are arranged two dimensionally, the plurality of x electrodes extending parallel to a first direction which is parallel to a surface of the phosphor element array, and the plurality of y electrodes 13 extending parallel to each other in a second direction which intersects with the first direction at right angles. The thin film transistor 11 in the phosphor element array connects the x electrode 12 to the y electrode 13. The phosphor element specified by the pair of x electrode 12 and y electrode 13 becomes a pixel. According to the active matrix display device 30, as described above, an inorganic phosphor layer 4 constituting the phosphor element of each pixel includes an electron transporting organic material 5 on its surface. Thus, since electrons are effectively injected into the inorganic phosphor layer 4 to emit, the display device can be driven at low voltage, implementing high luminance and long life. In addition, a full-color display device using the three primary colors is provided by arranging the inorganic phosphor particles 4 in each of pixels 41a (R), 41b (G), and 41c (B) according to the luminescent color. In addition, a color filter may be provided in the phosphor direction in order to adjust the color purity of each color of RGB. Furthermore, the inorganic fluorescent substance 4 which emits one color may be used in every pixel 41, and a color conversion layer and the color filter may be further provided ahead of the phosphor direction. Thus, when the color conversion layer absorbs blue light generated from the inorganic phosphor layer, green or red light is generated and when they are taken out respectively, there can be provided a full-color display device using the three primary colors according to another example.

Next, a description will be made of a manufacturing method of the active matrix display device 30 with reference to FIG. 4. Similar to the phosphor element 10 in the first embodiment, the thin film transistor 11 is formed on a transparent substrate 1 and a transparent electron hole injection electrode 2 is formed and then an electron hole transport layer 3 is formed by the inkjet method, for example. Then, the inorganic phosphor layer 4 is formed by a high-frequency sputtering method, for example and an electron transport layer 7 is formed. Then, an electron injection electrode 8 is formed by the vacuum evaporation method, for example. In the case of the color display device, when the inorganic phosphor layer 4 is formed, the pixel (R) 41a, the pixel (G) 41b, and the pixel (B) 41c are formed so as to be separated by color by aligning a metal mask according to a pixel pitch using the vacuum evaporation method, for example. Before this step, a pixel separating region 42 which separates each pixel may be formed. In addition, the above manufacturing method is just one example and the present invention is not limited to this.

Next, a description will be made further in detail with reference to concrete working examples.

Working Example 1

A phosphor element according to a working example 1 of the present invention will be described with reference to FIG. 1. Since the phosphor element has the same constitution as that of the phosphor element 10 according to the first embodiment, a description of its constitution will be omitted. According to this phosphor element, a commercially available glass substrate having an ITO film was used as the transparent substrate 1 on which the transparent electron hole injection electrode 2 was formed. In addition, ZnO was used in the inorganic phosphor layer 4. Since it is thought that Zn excess part exists as a lattice defect in ZnO and this lattice defect functions as the emission center, an activator agent such as the rare-earth ion and the like is not needed. As the electron transporting organic material 5 chemically adsorbed to the surface of the inorganic phosphor layer 4, a PBD derivative was used. In addition, PEDOT was used in the electron hole transport layer 3, Alq3 was used in the electron transport layer 7 and Al was used in the electron injection electrode.

Next, a description will be made of a manufacturing method of the phosphor element. The phosphor element is manufactured by the following steps.

(a) The commercially available glass substrate having the ITO film was prepared as the transparent substrate 1 on which the transparent electron hole injection electrode 2 was formed. Then, ultrasonic cleaning was performed on this using alkali detergent, water, acetone, and isopropyl alcohol (IPA). Then, this was taken out of the boiling IPA solution and dried and cleaned by $UV/O_3$.

(b) Then, PEDOT was dissolved with chloroform and applied to the glass substrate having the ITO film by the spin coat method to form the electron hole transport layer 3. The film thickness thereof was 100 nm.

(c) Then, the thin film of ZnO was formed by the high-frequency sputtering method to form the inorganic phosphor layer 4. The film thickness was 100 nm. Thus, a substrate A was provided.

(d) Then, the substrate A was soaked in ethanol and the PBD derivative was put in also and left for one night while they were continuously stirred. Thus, the electron transporting organic material 5 was chemically adsorbed to the surface of the inorganic phosphor layer 4.

(e) Then, Alq3 was stacked on the electron transporting organic material 5 by the vacuum evaporation method to form the electron transport layer 7. The film thickness thereof was 50 nm.

(f) Then, Al was stacked on the electron transport layer 7 by the vacuum evaporation method to form the electron injection electrode 8. The film thickness thereof was 200 nm.

(g) Then, it was packaged on the glass substrate with an epoxy adhesive under a circumstances of low moisture and low oxygen concentration to provide the phosphor element.

When a DC voltage was applied to the phosphor element manufactured as described above, emission luminance was 420 $cd/m^2$ at 20V. This was higher than a comparative example 1 which will be shown below. In addition, according to a life test performed on this phosphor element at initial luminance of 200 $cd/m^2$, a life until the luminance is reduced by half was 17000 hours, which was longer than that of the comparative example 1.

Working Example 2

A display device according to a working example 2 of the present invention will be described with reference to FIG. 4. The display device has a thin film transistor 11 similar to the display device 30 according to the third embodiment, but it is different from the display device 30 in that it has three pixels (R) 41a, (G) 41b, and (B) 41c for colors RGB. The color of the inorganic phosphor layer 4 is varied according to the pixels (R) 41a, (G) 41b, and (B) 41c.

A description will be made of a manufacturing method of the display device. Since the display device is provided such that plurality of the phosphor elements 10 according to the first embodiment are arranged two dimensionally, it is substantially the same as that of the phosphor element 10 according to the first embodiment. According to the manufacturing method of the display device, the inorganic phosphor layer 4 which is varied according to the pixels (R) 41a, (G) 41b, and (B) 41c is used.

Comparative Example 1

Similar to the wording example 1, after the electron hole transport layer 3 was formed, a phosphor layer in which 3-(2-benzothiazolyl)-7-diethylaminocoumarin (coumarin 6) was doped in Alq3 was formed by the vacuum evaporation method. Then, similar to the working example 1, the electron transport layer 7 and the electron injection electrode 8 were formed and packaged to provide the phosphor element.

When a DC voltage was applied to the phosphor element manufactured as described above, emission luminance was 310 cd/m$^2$ at 8V. In addition, according to a life test performed on this phosphor element under the same initial luminance as that of the working example 1, a life until the luminance is reduced by half was 8000 hours.

Fourth Embodiment

Figure 6:
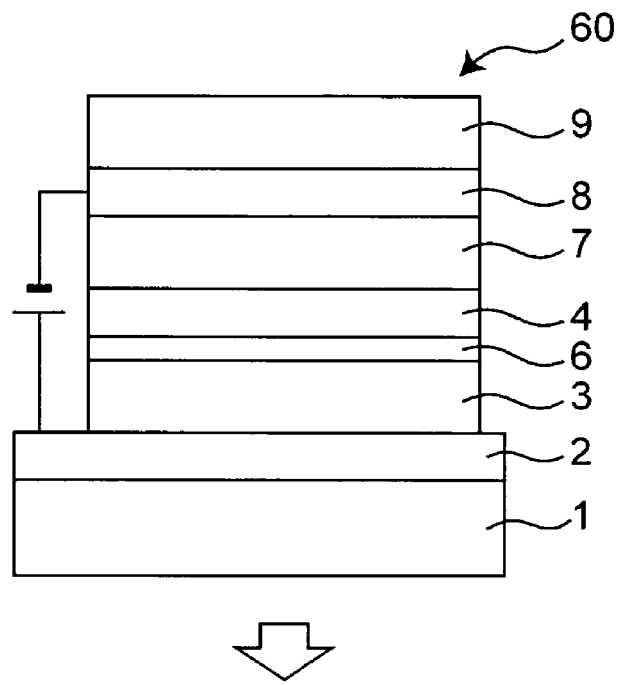
FIG. 6 is a sectional view showing a phosphor element and perpendicular to its emission surface according to a fourth embodiment of the present invention.

A phosphor element according to a fourth embodiment of the present invention will be described with reference to FIG. 6. FIG. 6 is a sectional view showing the phosphor element and perpendicular to its emission surface. The phosphor element 60 is different from the phosphor element 10 according to the first embodiment in that an electron hole transporting organic material 6 is chemically adsorbed to an inorganic phosphor layer 4 instead of the electron transporting organic material 5. More specifically, according to the phosphor element 60, the electron hole transporting organic material 6 is chemically adsorbed to the side, which is disposed opposite to the electron hole injection electrode 2, of two interfaces of the inorganic phosphor layer 4. In addition, the phosphor element 60 is different from the phosphor element 10 according to the first embodiment in that an electron hole transport layer 3 functions as a bonding layer. Since the other components are substantially the same, their description will be omitted.

The electron hole transporting organic material 6 includes an electron hole transporting property, which includes the same material used in the above electron hole transport layer 3. In addition, since a method of chemically adsorbing the electron hole transporting organic material 6 to the surface of the inorganic phosphor layer 4 is substantially the same as that of chemically adsorbing the electron transporting organic material 5 to the surface of the inorganic phosphor layer 4, its description will be omitted.

In addition, it is preferable that the electron hole transport layer 3 includes a high-molecular material which functions as a bonding layer between the inorganic phosphor layer 4 on which the electron hole transporting organic material 6 is adsorbed and the electron hole injection electrode 2. As this electron hole transport layer 3, among the material used in the above electron hole transport layer 3, the high-molecular material including the electron hole transporting property, a material in which molecules of the low-molecular electron hole transporting material are diffused in the conductive or non-conductive polymer, or a material in which a p-type semiconductor inorganic material is diffused can be used.

Next, a description will be made of a manufacturing method of the phosphor element 60 according to the fourth embodiment of the present invention. The phosphor element 10 is manufactured according to the following steps.

(a) A substrate 9 was prepared.
(b) Then, an electron injection electrode 8 was formed on the substrate 9 by the vacuum evaporation method, for example.
(c) Then, an electron transport layer 7 was formed on the electron injection electrode 8 by the vacuum evaporation method, for example.
(d) Then, the inorganic phosphor layer 4 was formed on the electron transport layer 7 by the high-frequency sputtering method, for example.
(e) Then, similar to the working example 1, the electron hole transporting organic material 6 was chemically adsorbed to the surface of the inorganic phosphor layer 4. Thus, at least a part of the surface of the inorganic phosphor layer 4 was covered with the electron hole transporting organic material 6. Thus, a substrate C was provided.
(f) A transparent substrate 1 was prepared.
(g) Then, the electron hole injection electrode 2 was formed on the transparent substrate 1 by the sputtering method, for example.
(h) Then, the electron hole transport layer 3 was formed on the electron hole injection electrode 2 by the spin coat method, for example. Thus, a substrate D was provided.
(i) Then, immediately after the electron hole transport layer 3 was formed, the inorganic phosphor layer 4 of the substrate C was put on the electron hole transport layer 3 of the substrate D so that the substrate C and the substrate D were bonded. Thus, the phosphor element 60 was provided.

Fifth Embodiment

Figure 7:
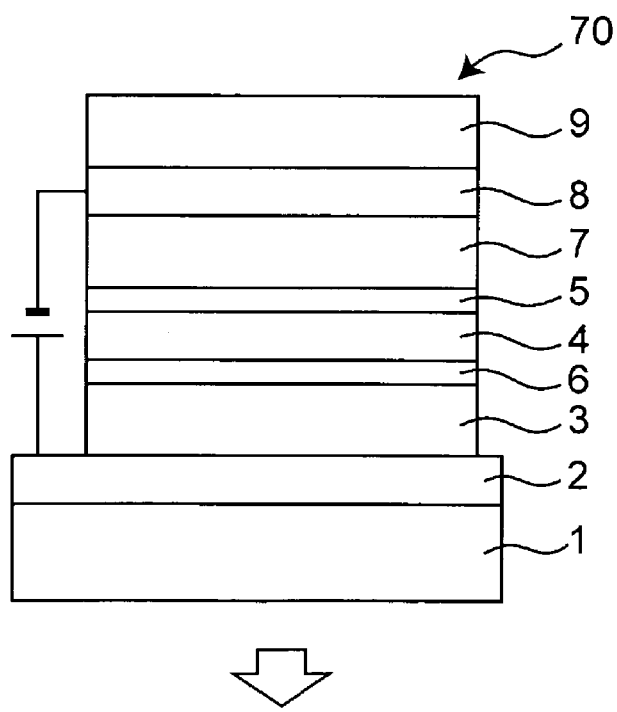
FIG. 7 is a sectional view showing a phosphor element and perpendicular to its emission surface according to a fifth embodiment of the present invention.

A phosphor element according to a fifth embodiment of the present invention will be described with reference to FIG. 7. FIG. 7 is a sectional view showing the phosphor element and perpendicular to its emission surface. The phosphor element 70 is different from the phosphor element 60 according to the fourth embodiment in that an electron transporting organic material 5 is further chemically adsorbed to an inorganic phosphor layer 4. More specifically, according to the phosphor element 70, an electron hole transporting organic material 6 is chemically adsorbed to an interface disposed opposite to an electron hole injection electrode 2, and the electron transporting organic material 5 is chemically adsorbed to an interface disposed opposite to an electron injection electrode 7 of two interfaces of the inorganic phosphor layer 4. In addition, since the other components are the same as those of the phosphor element 10 according to the first embodiment and the 60 according to the fourth embodiment of the present invention, their description will be omitted.

Next, a manufacturing method of the phosphor element 70 according to the fifth embodiment of the present invention will be described. The phosphor element 70 is manufactured by the following steps.

(a) A KCl substrate was prepared.
(b) Then, the inorganic phosphor layer 4 was formed on the KCl substrate by the high-frequency sputtering method, for example.
(c) Then, similar to the phosphor element 60 according to the fourth embodiment, the electron hole transporting organic material 6 was chemically adsorbed to a surface of the inorganic phosphor layer 4. Thus, at least one part of the surface of the inorganic phosphor layer 4 was covered with the electron hole transporting organic material 6. Thus, a substrate E was provided.

(d) A transparent substrate 1 was prepared.

(e) Then, the electron hole injection electrode 2 was formed on the transparent substrate 1 by the sputtering method, for example.

(f) Then, an electron hole transport layer 3 was formed on the electron hole injection electrode 2 by the spin coat method, for example. Thus, a substrate F was provided.

(g) Then, immediately after the electron hole transport layer 3 was formed, the inorganic phosphor layer 4 of the substrate E was put on the electron hole transport layer 3 of the substrate F so that the substrate E and the substrate F were bonded.

(h) Then, the KCl is eluted into water and removed from the side of the substrate E and the surface of the inorganic phosphor layer 4 was exposed.

(i) Then, similar to the working example 1, the electron transporting organic material 5 was chemically adsorbed to the surface of the exposed inorganic phosphor layer 4 and then, the electron transport layer 7 and an electron injection electrode 8 were formed thereon.

(j) A protection layer is formed on the electron injection electrode 8. Thus, the phosphor element 70 is provided.

Sixth Embodiment

Figure 8:
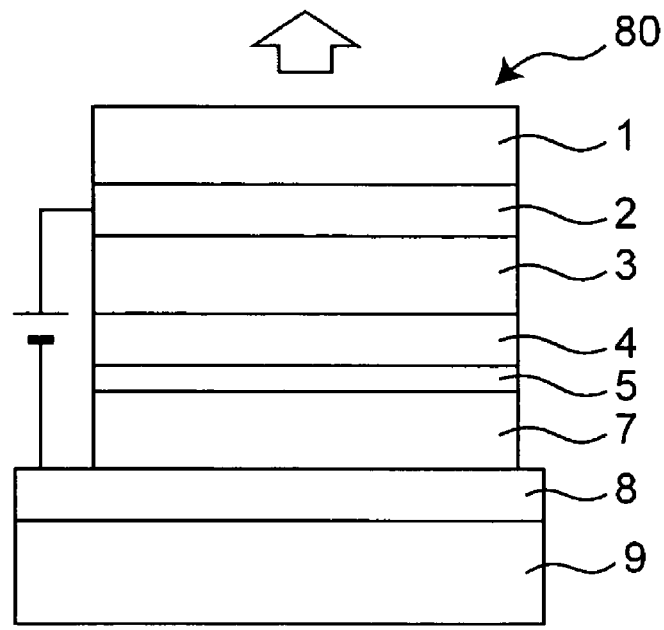
FIG. 8 is a sectional view showing a phosphor element and perpendicular to its emission surface according to a sixth embodiment of the present invention.

A phosphor element according to a sixth embodiment of the present invention will be described with reference to FIG. 8. FIG. 8 is a sectional view showing the phosphor element and perpendicular to its emission surface. The phosphor element 80 is different from the phosphor element 10 according to the first embodiment in that a phosphor direction and a polarity of a driving power supply are reversed, and a stacked constitution of an electron hole injection electrode, an electron injection electrode, an electron hole transport layer and an electron transport layer is reversed according to the polarity of the above drive power supply, and furthermore the electron transport layer 7 functions as a bonding layer. In addition, the light is emitted from the side of a transparent substrate 1 as shown by an arrow in the drawing. In addition, since the other components are substantially the same, their description will be omitted.

It is preferable that the electron transport layer 7 contains a high-molecular material which functions as the bonding layer between the inorganic phosphor layer 4 on which the electron transporting organic material 5 is adsorbed and the electron injection electrode 8. As the electron transport layer 7, among the material used in the above electron hole transport layer 7 of the phosphor element 10 according to the first embodiment, the high-molecular material including the electron transporting property, the material in which molecules of the low-molecular electron transporting material are diffused in the conductive or non-conductive polymer, or the material in which an n-type semiconductor inorganic material is diffused can be used.

Next, a description will be made of a manufacturing method of the phosphor element 80 according to the sixth embodiment of the present invention. The phosphor element 80 is manufactured according to the following steps.

(a) A transparent substrate 1 was prepared.

(b) Then, an electron hole injection electrode 2 was formed on the transparent substrate 1 by the sputtering method, for example.

(c) Then, similar to the working example 1, an electron hole transport layer 3, and an inorganic phosphor layer 4 were formed on the electron hole injection electrode 2 and the electron transporting organic material 5 was chemically adsorbed to the surface of the inorganic phosphor layer 4. Thus, at least a part of the surface of the inorganic phosphor layer 4 was covered with the electron transporting organic material 5. Thus, a substrate G was provided.

(d) A substrate 9 was prepared.

(e) Then, an electron injection electrode 8 was formed on the substrate 9 by the vacuum evaporation method, for example.

(f) Then, an electron transport layer 7 was formed on the electron injection electrode 8 by the spin coat method, for example. Thus, a substrate H was provided.

(g) Then, immediately after the electron transport layer 7 was formed, the inorganic phosphor layer 4 of the substrate G was put on the electron transport layer 3 of the substrate H so that the substrate G and the substrate H were bonded. Thus, the phosphor element 80 was provided.

Seventh Embodiment

Figure 9:
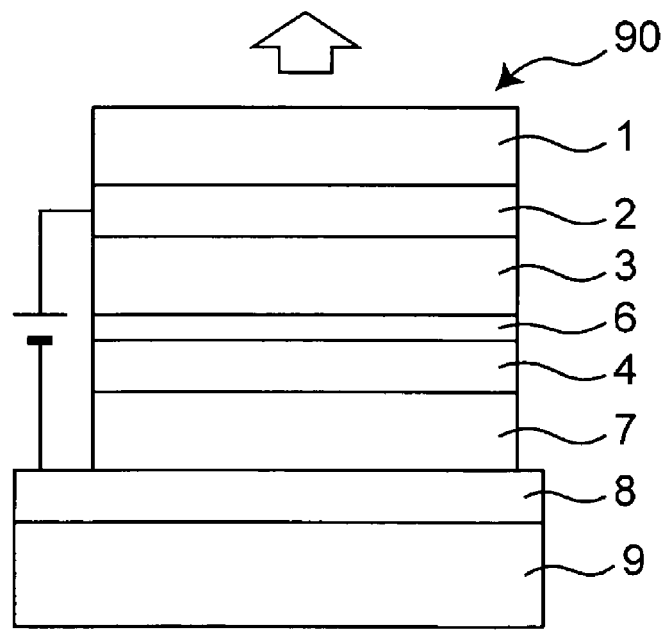
FIG. 9 is a sectional view showing a phosphor element and perpendicular to its emission surface according to a seventh embodiment of the present invention.

A phosphor element according to a seventh embodiment of the present invention will be described with reference to FIG. 9. FIG. 9 is a sectional view showing the phosphor element and perpendicular to its emission surface. The phosphor element 90 is different from the phosphor element 60 according to the fourth embodiment in that a phosphor direction and a polarity of a driving power supply are reversed, and a stacked constitution of an electron hole injection electrode, an electron injection electrode, an electron hole transport layer and an electron transport layer is reversed according to the polarity of the above drive power supply. In addition, the light is emitted from the side of a transparent substrate 1 as shown by an arrow in the drawing. In addition, since the other components are substantially the same, their description will be omitted.

Next, a description will be made of a manufacturing method of the phosphor element 90 according to the seventh embodiment of the present invention. The phosphor element 90 is manufactured according to the following steps.

(a) Similar to the phosphor element 60 according to the fourth embodiment, an electron injection electrode 8, an electron transport layer 7, and an inorganic phosphor layer 4 were formed on a substrate 9 and an electron hole electron transporting organic material 6 was chemically adsorbed to the surface of the inorganic phosphor layer 4. Thus, at least a part of the surface of the inorganic phosphor layer 4 was covered with the electron hole transporting organic material 6. Thus, a substrate I was provided.

(b) Then, similar to the phosphor element 60 according to the fourth embodiment, an electron hole injection electrode 2 and an electron hole transport layer 3 were formed on a transparent substrate 1. Thus, a substrate J was provided.

(c) Then, immediately after the electron hole transport layer 3 was formed, the inorganic phosphor layer 4 of the substrate I was put on the electron hole transport layer 3 of the substrate J so that the substrate I and the substrate J were bonded. Thus, the phosphor element 90 was provided.

Eighth Embodiment

Figure 10:
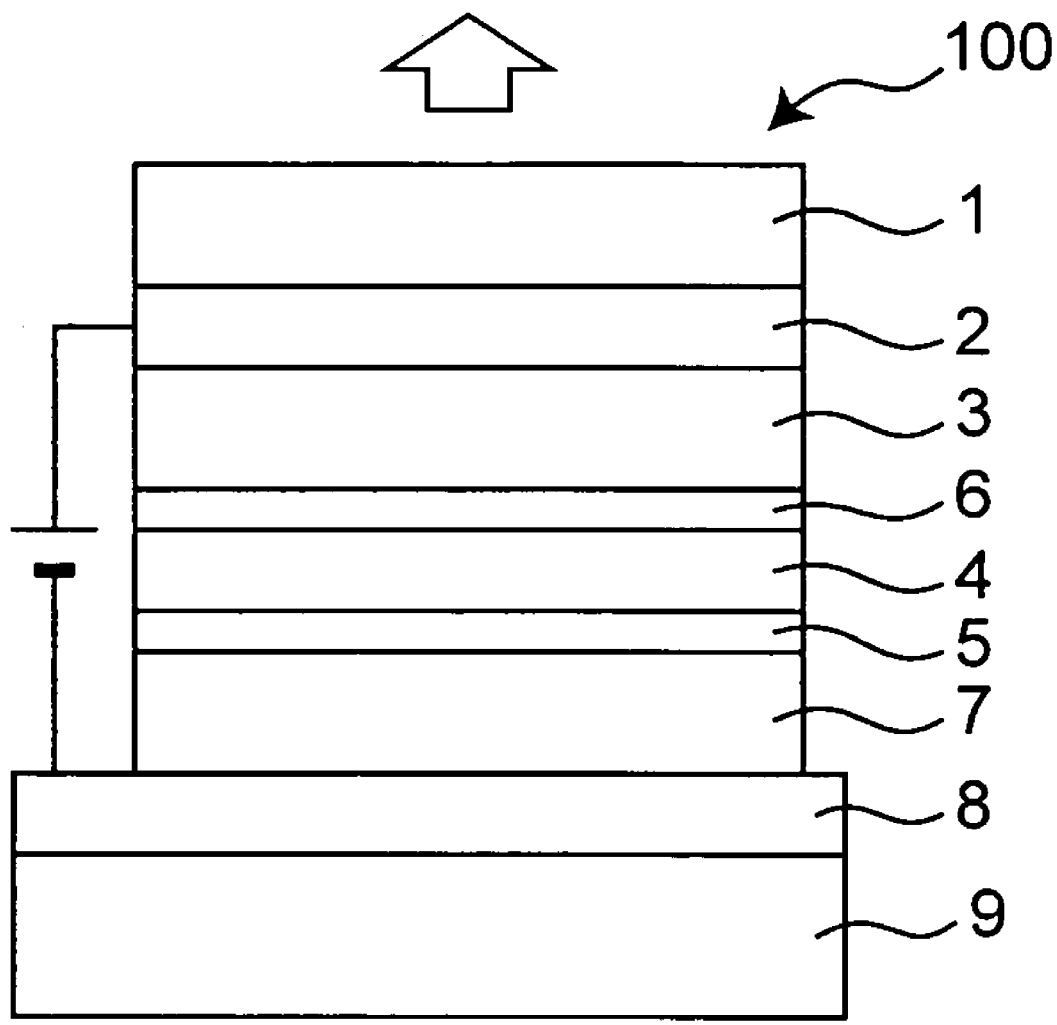
FIG. 10 is a sectional view showing a phosphor element and perpendicular to its emission surface according to an eighth embodiment of the present invention.

A phosphor element according to an eighth embodiment of the present invention will be described with reference to FIG. 10. FIG. 10 is a sectional view showing the phosphor element and perpendicular to its emission surface of the phosphor element. The phosphor element 100 is different from the phosphor element 70 according to the fifth embodiment in that a phosphor direction and a polarity of a driving power supply are reversed, and a stacked constitution of an electron hole injection electrode, an electron injection electrode, an electron hole transport layer and an electron transport layer is reversed according to the polarity of the above drive power supply, and furthermore, the electron transport layer 7 also functions as a bonding layer in addition to the electron hole transport layer 3. In addition, the light is emitted from the side of a transparent substrate 1 as shown by an arrow in the drawing. In addition, since the other components are substantially the same, their description will be omitted.

Next, a description will be made of a manufacturing method of the phosphor element 100 according to the eighth embodiment of the present invention. The phosphor element 100 is manufactured according to the following steps.

(a) Similar to the method of chemically adsorbing the electron hole transporting organic material 6 to the phosphor element 70 according to the fifth embodiment, the inorganic phosphor layer 4 was formed on a KCl substrate and the electron transporting organic material 5 was chemically adsorbed to the surface of the inorganic phosphor layer 4. Thus, at least one part of the inorganic phosphor layer 4 was covered with the electron transporting organic material 5. Thus, a substrate K was provided.

(b) Similar to the phosphor element 80 according to the sixth embodiment, the electron injection electrode 8 and the electron transport layer 7 were formed on a substrate 9. Thus, a substrate L was provided.

(c) Immediately after the electron transport layer 7 was formed, the inorganic phosphor layer 4 of the substrate K was put on the electron transport layer 7 of the substrate L so that the substrate K and the substrate L were bonded.

(d) Then, similar to the phosphor element 70 according to the fifth embodiment, a surface of the inorganic phosphor layer 4 was exposed and the electron hole transporting organic material 6 was chemically adsorbed to it. Thus, at least a part of the surface of the inorganic phosphor layer 4 was covered with the electron hole transporting organic material 6. Thus, a substrate M was provided.

(e) Similar to the phosphor element 90 according to the seventh embodiment, an electron hole injection electrode 2 and an electron hole transport layer 3 were sequentially formed on a transparent substrate 1. Thus, a substrate N was provided.

(f) Then, immediately after the electron hole transport layer 3 was formed, the inorganic phosphor layer 4 of the substrate M was put on the electron hole transport layer 3 of the substrate N so that the substrate M and the substrate N were bonded. Thus, the phosphor element 100 was manufactured.

In addition, although there are two layers formed of the organic material except for the inorganic phosphor layer 4 in the above description, such layers may be provided two or more.

In addition, according to the phosphor elements in the fourth to eighth embodiments, it is preferable that the chemical adsorption of the electron hole transporting organic material 5 or the electron transporting organic material 6, the forming operation of each layer, and the bonding operation of the substrates are performed in a dried atmosphere and it is more preferable that those are performed in a low-oxygen atmosphere. Thus, improvement in characteristics such as lowering of a working voltage, high efficiency, a longer life and the like can be implemented. The electron hole transport layer 3 or the electron transport layer 7 serving as the bonding layer preferably contains a bridging or polymerizing material which works with light or heat, in the vicinity of its interface. In this case, when the substrates are bonded, the bonding force can be improved by applying light or heat.

Ninth Embodiment

Figure 11:
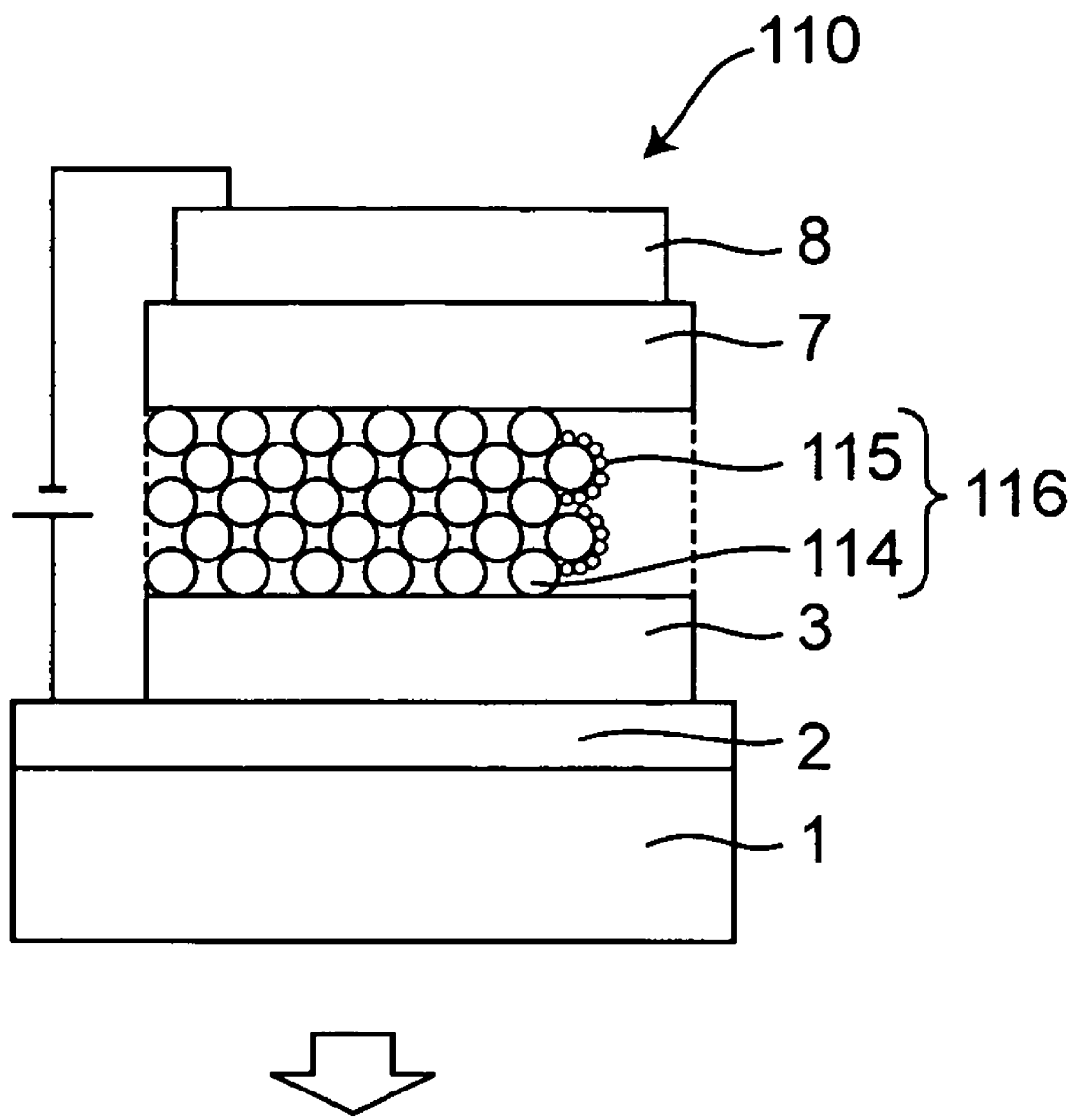
FIG. 11 is a sectional view showing a phosphor element and perpendicular to its emission surface according to a ninth embodiment of the present invention.

A phosphor element according to a ninth embodiment of the present invention will be described with reference to FIG. 11. FIG. 11 is a sectional view showing the phosphor element and perpendicular to its emission surface. The phosphor element 110 is different from the phosphor element 10 according to the first embodiment in that a phosphor layer 116 including inorganic phosphor particles 114 is provided as an illuminant instead of the inorganic phosphor layer 4, and more specifically, the phosphor layer 116 including the inorganic phosphor particles 114, to which a conductive organic material 115 is chemically adsorbed instead of the electron transporting organic material 5. Furthermore, the phosphor element 110 includes a transparent substrate 1, an electron hole injection electrode 2 provided on the transparent substrate 1, an electron injection electrode 8 provided so as to be disposed opposite to the electron hole injection electrode 2, and the phosphor layer 116 sandwiched between the electron hole injection electrode 2 and the electron injection electrode 8. Still furthermore, the phosphor element 110 includes an electron hole transport layer 3 between the electron hole injection electrode 2 and the phosphor layer 116, and an electron transport layer 7 between the phosphor layer 116 and the electron injection electrode 8. In addition, light is emitted from the side of the transparent substrate 1 as shown by an arrow in the drawing.

Next, a description will be made of each component of the phosphor element 110 in detail. In addition, regarding substantially the same components as that of the phosphor element 10 according to the first embodiment, a description thereof will be omitted.

According to the phosphor layer 116, it contains inorganic phosphor particles 114 in which at least a part of its surface is covered with the conductive organic material 115. It is preferable that the conductive organic material 115 is chemically adsorbed to the surface of the inorganic phosphor particle 114.

As the inorganic phosphor particle 114, substantially the same one as that of the inorganic phosphor layer 4 of the phosphor element 10 according to the first embodiment can be used. The conductive organic material 115 which is chemically adsorbed to the surface of the inorganic phosphor particle 114 includes an electron hole transporting property and/or an electron transporting property, which may include one or more materials. In addition, the conductive organic material 115 includes a low-molecular material and a high-molecular material.

As the organic material including the electron hole transporting property, substantially the same one used in the electron hole transport layer 3 of the phosphor element 10 according to the first embodiment can be used, and as the organic material including the electron transporting property, substantially the same one used in the electron transporting organic material 5 of the phosphor element 10 according to the first embodiment can be used.

In addition, as a material including both electron hole transporting property and electron transporting property, a bipolar high-molecular material which copolymerizes a unit including the electron hole transporting property and a unit including the electron transporting property in their molecular chains may be used. For example, there is P (VK-co-OXD) which randomly copolymerize 9-vynylcarbazole as the electron hole transporting unit and oxadiazole vinylmonomer as the electron transporting unit, PTPDOXD in which TPD as the electron hole transporting unit and oxadiazole as the electron transporting unit are alternately arranged and the like.

Next, a description will be made of a method of chemically adsorbing the conductive organic material 115 to the surface of the inorganic phosphor particle 114. Since the method of the chemical adsorption is substantially the same as the method of chemically adsorbing the electron transporting organic material 5 to the surface of the inorganic phosphor layer 4 in the phosphor element 10 according to the first embodiment, its description will be omitted. In addition, the chemical adsorption between the conductive organic material 115 and the surface of the inorganic phosphor particle 114 protects the inorganic phosphor particle 114 from being influenced by water and the like and it is effective in improving chemical stability and a handling ability.

According to a method of forming the phosphor layer 116 including the inorganic phosphor particles 114, the inorganic phosphor particles 114 are diffused in an organic solvent and the like which does not fuse the conductive organic material 115, and various applying method such as the inkjet method, the dipping method, the spin coat method and the like can be used. In addition, the inorganic phosphor particles 114 may be diffused in a transparent conductive matrix. A material of the matrix may be the above-described electron hole transporting polymer or electron transporting polymer and another conductive polymer. The conductive polymer preferably includes polyacetylene series; polyphenylene series such as polyparaphenylene, polyphenylenevinylene, poliphenylenesulfide, polyphenyleneoxide; heterocyclic polymer series such as polyryrrole, polythiophene, polyfurane, polyselenophene, polytellurophene; ionic polymer series such as polyaniline; polyacene series; polyester series; metal phthalocyanine series, these derivative, copolymer and mixture, and the like. In addition, its conductivity may be adjusted by dispersing low-molecular organic material having the electron hole transporting property or the electron transporting property, or an inorganic conductive or inorganic semi-conductive material, in the conductive or non-conductive polymer. Thus, the surface of the inorganic phosphor particle 114 is prevented from being charged and following electrons can be prevented from being repelled. Furthermore, the phosphor layer 116 may contain a surface-active agent as a diffusion auxiliary agent. Thus, diffusion stability is improved and uniformity in the phosphor layer 116 is improved.

Next, a description will be made of a mechanism of emission of the phosphor element 110 formed as described above. The conductive organic material 115 is a material having carriers (electron hole and electron) transporting property alone and it has a molecular structure in which $\pi$ electron cloud to transport electrons is largely spread. As describe above, since the conductive organic material 115 is chemically adsorbed to the surface of the inorganic phosphor particle 114 and conductivity of the host crystal is high, the spread of the $\pi$ electron cloud of the conductive organic material 115 affects up to the surface of the inorganic phosphor particle 114 and carriers are injected without being hindered by the injection barrier. The following two processes are thought in the course of emission. That is, according to the first process, the carriers injected in the inorganic phosphor particles 114 are moved to the vicinity of the emission center of the host crystal and the electron hole is captured by an acceptor level and the electrons are captured by a donor level, and light is emitted when they are recombined. According to the second process, electron transition of rare-earth ion and the like which is activated by movement of recombination energy in the emission center is generated and the light is emitted when it is alleviated. It is thought that the first and second emission processes are mixed in practice.

Tenth Embodiment

Figure 12:
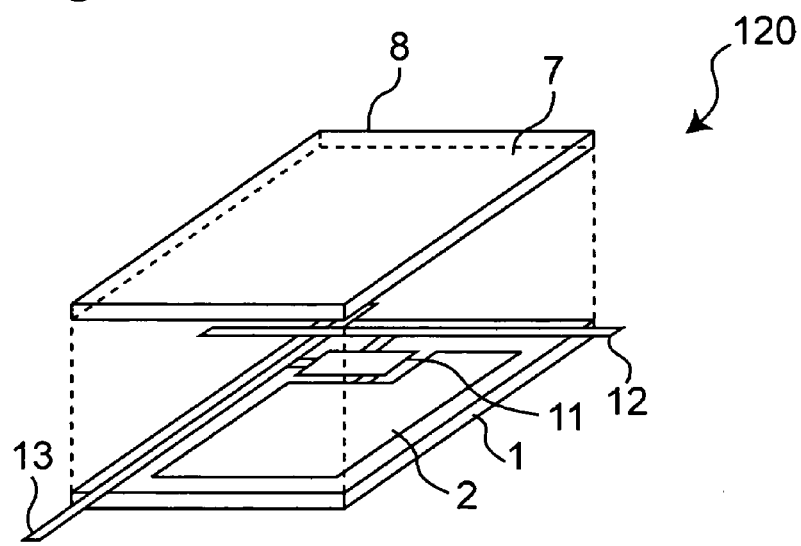
FIG. 12 is a perspective view showing a phosphor element according to a tenth embodiment of the present invention.

A phosphor element according to a tenth embodiment of the present invention will be described with reference to FIG. 12. FIG. 12 is a perspective view showing an electrode constitution of the phosphor element 120. The phosphor element 120 further includes a thin film transistor 11 connected to a transparent electron hole injection electrode 2. An x electrode 12 and a y electrode 13 are connected to the thin film transistor 11. In addition, when the thin film transistor is used, the phosphor element 120 has a memory function. As this thin film transistor 11, low-temperature polysilicon or amorphous silicon thin film transistor and the like may be used. Furthermore, it may be an organic thin film transistor constituted by a thin film formed of an organic material.

Eleventh Embodiment

Figure 13:
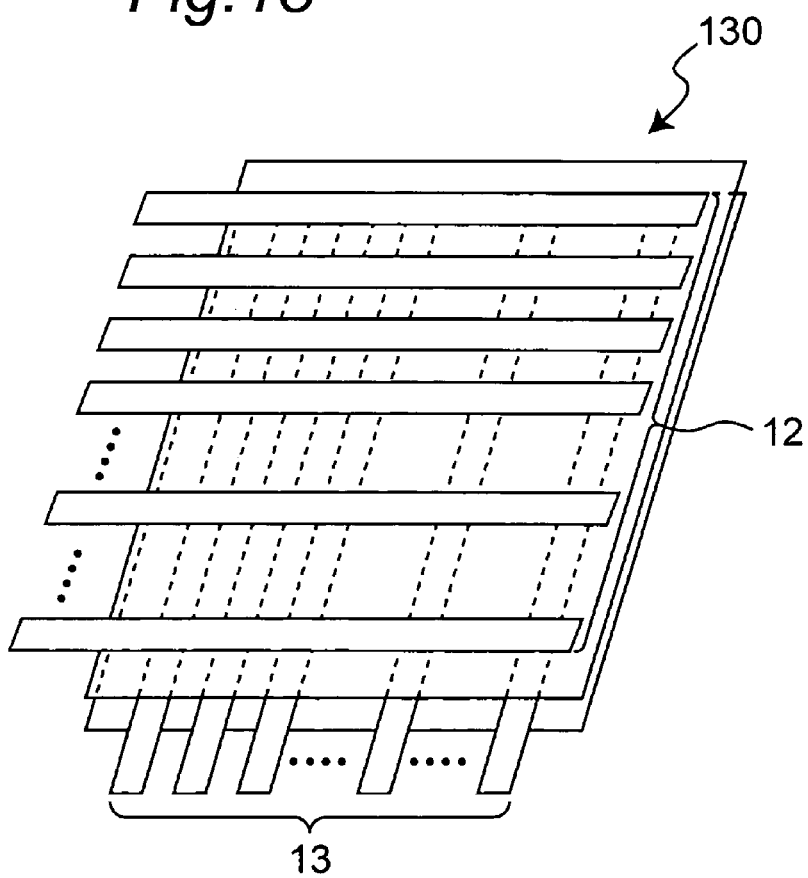
FIG. 13 is a schematic plan view showing a display device using a phosphor element according to a eleventh embodiment of the present invention.
Figure 14:
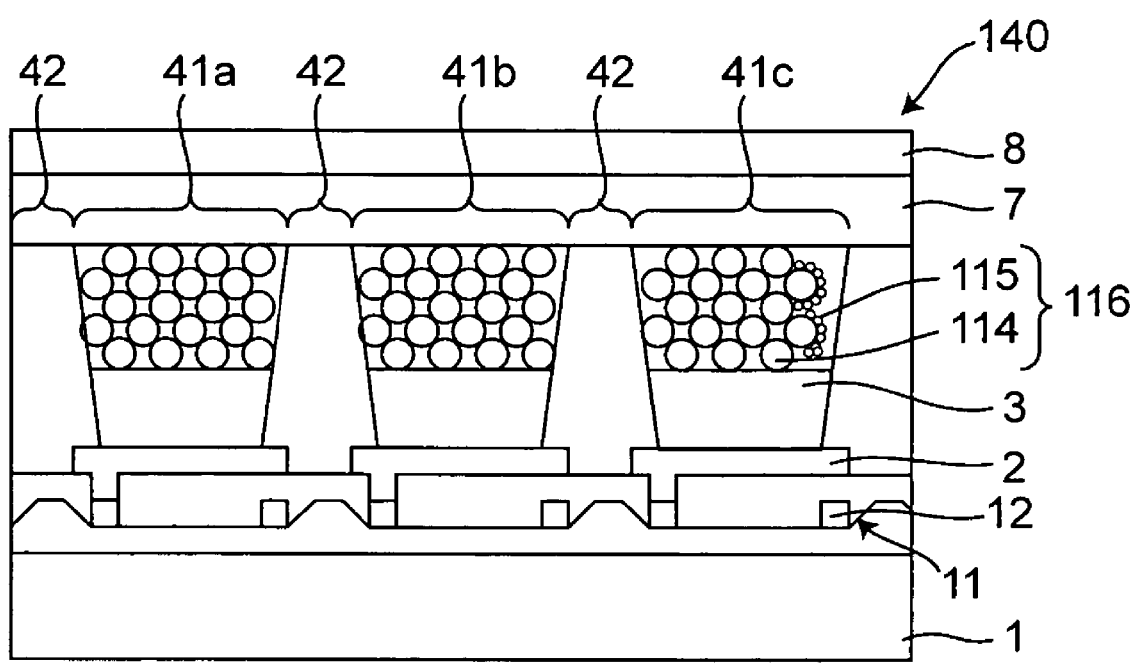
FIG. 14 is a sectional view showing a display device using the phosphor element and perpendicular to its emission surface according to the eleventh embodiment of the present invention.

A display device according to an eleventh embodiment of the present invention will be described with reference to FIGS. 13 and 14. FIG. 13 is a schematic view showing an active matrix of the display device 130 which is constituted by x electrodes 12 and y electrodes 13 which intersect with each other. FIG. 14 is a sectional view showing the display device 130 and parallel to the x electrodes 12 and perpendicular to its emission surface. The display device 130 is an active matrix display device having a thin film transistor 11. The active matrix display device 130 includes a phosphor element array in which a plurality of phosphor elements shown in FIG. 12 are arranged two dimensionally, the plurality of x electrodes 12 extending parallel to each other in a first direction which is parallel to a surface of the phosphor element array, and the plurality of y electrodes 13 extending parallel to each other in a second direction which intersects with the first direction at right angles. The thin film transistor 11 in the phosphor element connects the x electrode 12 to the y electrode 13. The phosphor element specified by the pair of x electrode 12 and y electrode 13 becomes a pixel. According to the active matrix display device 130, as described above, a phosphor layer 116 constituting the phosphor element of each pixel includes inorganic phosphor particles 114 having a conductive organic material 115 on its surface. Thus, since the carrier can be effectively injected to the inorganic phosphor particles 114 and the inorganic phosphor particles 114 can emit light, the display unit can be driven at the low voltage and has a long life. In addition, when the inorganic phosphor particles 114 are arranged in each of the pixels 41$a$ (R), 41$b$ (G), and 41 (C) depending on its luminescent color, there can be provided a full-color display device using the three primary colors.

Next, a description will be made of a manufacturing method of the active matrix display device 130 with reference to FIG. 14. Similar to the phosphor element 110 in the ninth embodiment, the thin film transistor 11 is formed on a transparent substrate 1 and then a transparent electron hole injection electrode 2 is formed and then an electron hole transport layer 3, a phosphor layer 116 and an electron transport layer 7 are sequentially formed by the inkjet method, for example. Then, an electron injection electrode 8 is formed by the vacuum evaporation method, for example. In the case of the color display device, when the phosphor layer 116 is formed, the pixel 41$a$ (R), the pixel 41$b$ (G), and the pixel 41$c$ (B) are formed so as to be separated by color by applying a solution containing the inorganic phosphor particles 114 of RGB so as to align with a pixel pitch using the ink jet method, for example. Before this step, a pixel separating region 42 which separates each pixel may be formed. In addition, the above manufacturing method is just one example and the present invention is not limited to this.

Working Example 3

A phosphor element according to a working example 3 of the present invention will be described with reference to FIG.

11. Since the phosphor element has the same constitution as that of the phosphor element 110 according to the ninth embodiment, a description of its constitution will be omitted. According to this phosphor element, a commercially available glass substrate having an ITO film was used as the transparent substrate 1 on which the transparent electron hole injection electrode 2 was formed. In addition, ZnO:Zn was used in the inorganic phosphor particle 114. Since it is thought that Zn excess part exists as a lattice defect in ZnO and this lattice defect functions as the emission center, an activator agent such as the rare-earth ion and the like is not needed. As the conductive organic material 115 to be chemically adsorbed on the surface of the inorganic phosphor particle 114, an α-NPD derivative and a PBD derivative were used. In addition, PEDOT was used in the electron hole transport layer 3, Alq3 was used in the electron transport layer 7 and Al was used in the electron injection electrode.

Next, a description will be made of a manufacturing method of the phosphor element. The phosphor element is manufactured by the following steps.

(a) The commercially available glass substrate having the ITO film was prepared as the transparent substrate 1 on which the transparent electron hole injection electrode 2 was formed. Then, ultrasonic cleaning was performed on this using alkali detergent, water, acetone, and isopropyl alcohol (IPA). Then, this was taken out of the boiling IPA solution and dried and cleaned by UV/$O_3$.

(b) Then, PEDOT is dissolved with chloroform and applied to the glass substrate having the ITO film by the spin coat method to form the electron hole transport layer 3. The film thickness thereof was 100 nm.

(c) The inorganic phosphor particle 4 to which the conductive organic material 5 was chemically adsorbed on the surface was diffused in ethanol using ultrasound and applied to the electron hole transport layer 3 by the spin coat method to form the phosphor layer 6. The film thickness thereof was 150 nm.

Here, a description will be made of a manufacturing method of the inorganic phosphor particle 4 to which the conductive organic material 5 is chemically adsorbed.

(1) First, fine crystal particle powder of ZnO:Zn is used as the inorganic phosphor particle and the fine crystal particle powder of ZnO:Zn is diffused in ethanol using an ultrasonic stirring apparatus.

(2) Then, an α-NPD derivative and a PBD derivative are soaked in the diffused solution and left for one night while continuously stirred. Thus, the inorganic phosphor particle 4 to which the α-NPD derivative and the PBD derivative are chemically adsorbed can be provided.

(d) Then, Alq3 was stacked on the phosphor layer 6 by the vacuum evaporation method to form the electron transport layer 7. The film thickness thereof was 50 nm.

(e) Then, Al was stacked on the electron transport layer 7 by the vacuum evaporation method to form the electron injection electrode 8. The film thickness thereof was 200 nm.

(f) Then, it was packaged on the glass substrate with an epoxy adhesive under a circumstances of low moisture and low oxygen concentration to provide the phosphor element.

When a DC voltage was applied to the phosphor element manufactured as described above, emission luminance was 400 cd/$m^2$ at 15V. This was higher than a comparative example 1 which will be shown below. In addition, according to a life test performed on this phosphor element at initial luminance of 200 cd/$m^2$, a life until the luminance is reduced by half was 18000 hours, which was longer than that of the comparative example 1.

Working Example 4

A display device according to a working example 4 of the present invention will be described with reference to FIG. 14.

The display device has a thin film transistor 11 similar to the display device 130 according to the eleventh embodiment, but it is different from the display device 130 in that it has three pixels (R) 41a, (G) 41b, and (B) 41c for colors RGB. The color of the inorganic phosphor particle 4 is varied according to the pixels (R) 41a, (G) 41b, and (B) 41c. In addition, a pixel separating region 42 which separates the pixels is provided in this display device. The pixel separating region 42 includes polyimide and its wall is formed by photo-etching.

A description will be made of a manufacturing method of the display device. Since the display device is provided such that the phosphor element 110 according to the ninth embodiment are arranged two dimensionally, it is the substantially the same as that of the phosphor element 110 according to the ninth embodiment. According to the manufacturing method of the display device, the inorganic phosphor layer 4 which is varied according to the pixels (R) 41a, (G) 41b, and (B) 41c is used. In this case, when the pixel separating region 42 is provided, positioning precision when the pixels 41a, 41b and 41c are formed is improved.

Comparative Example 2

Similar to the wording example 3, after an electron hole transport layer 3 was formed, a phosphor layer in which 3-(2-benzothiazolyl)-7-diethylaminocoumarin (coumarin 6) is doped in Alq3 was formed by the vacuum evaporation method. Then, similar to the working example 3, the electron transport layer 7 and the electron injection electrode 8 were formed and packaged to provide the phosphor element.

When a DC voltage was applied to the phosphor element manufactured as described above, emission luminance was 300 cd/$m^2$ at 7V. In addition, according to a life test performed on this phosphor element under the same initial luminance as that of the working example 1, a life until the luminance is reduced by half was 8,000 hours.

Twelfth Embodiment

Figure 15:
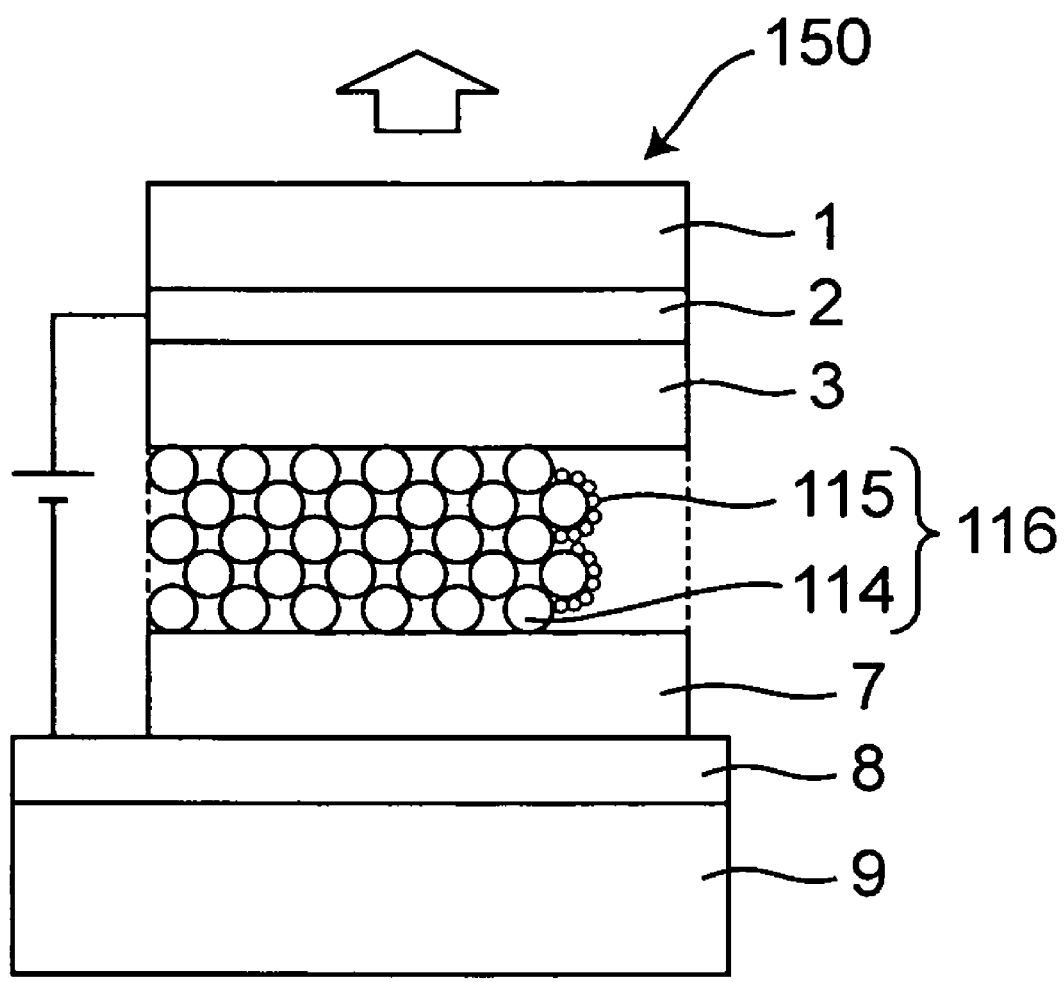
FIG. 15 is a sectional view showing a phosphor element and perpendicular to its emission surface according to a twelfth embodiment of the present invention.

A phosphor element according to a twelfth embodiment of the present invention will be described with reference to FIG. 15. FIG. 15 is a sectional view showing the phosphor element and perpendicular to its emission surface. The phosphor element 150 is different from the phosphor element 110 according to the ninth embodiment in that a phosphor direction and a polarity of a driving power supply are reversed, and a stacked constitution of an electron hole injection electrode, an electron injection electrode, an electron hole transport layer and an electron transport layer is reversed according to the polarity of the above drive power supply. In addition, the light is emitted from the side of a transparent substrate 1 as shown by an arrow in the drawing. In addition, since the other components are substantially the same, their description will be omitted. According to the phosphor element 150, since the transparent substrate such as the glass substrate used in the ninth embodiment is set on an upper surface, the light can be emitted from the upper surface without providing a protection layer. In addition, the phosphor element 150 can be formed by bonding the two substrates disposed opposite to each other by the electron hole transport layer or the electron transport layer.

Thirteenth Embodiment

Figure 16:
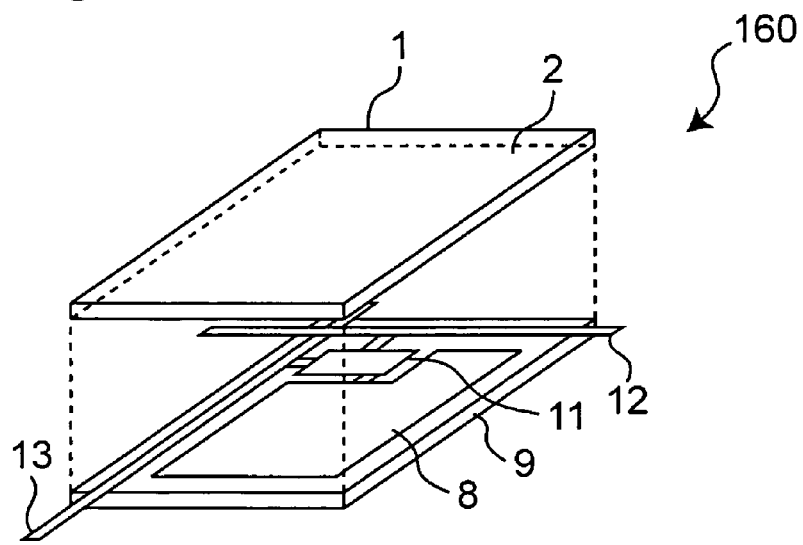
FIG. 16 is a perspective view showing a phosphor element according to a thirteenth embodiment of the present invention.

A phosphor element according to a thirteenth embodiment of the present invention will be described with reference to FIG. 16. FIG. 16 is a perspective view showing an electrode constitution of the phosphor element 160. The phosphor element 160 is different from the phosphor element 120 according to the tenth embodiment in that a phosphor direction and a polarity of a driving power supply are reversed, and a stacked constitution of an electron hole injection electrode and an electron injection electrode is reversed according to the polarity of the above drive power supply, and a thin film transistor 11 connected to an electron injection electrode 8 is provided. In addition, since the other components are substantially the same, their description will be omitted.

Fourteenth Embodiment

Figure 17:
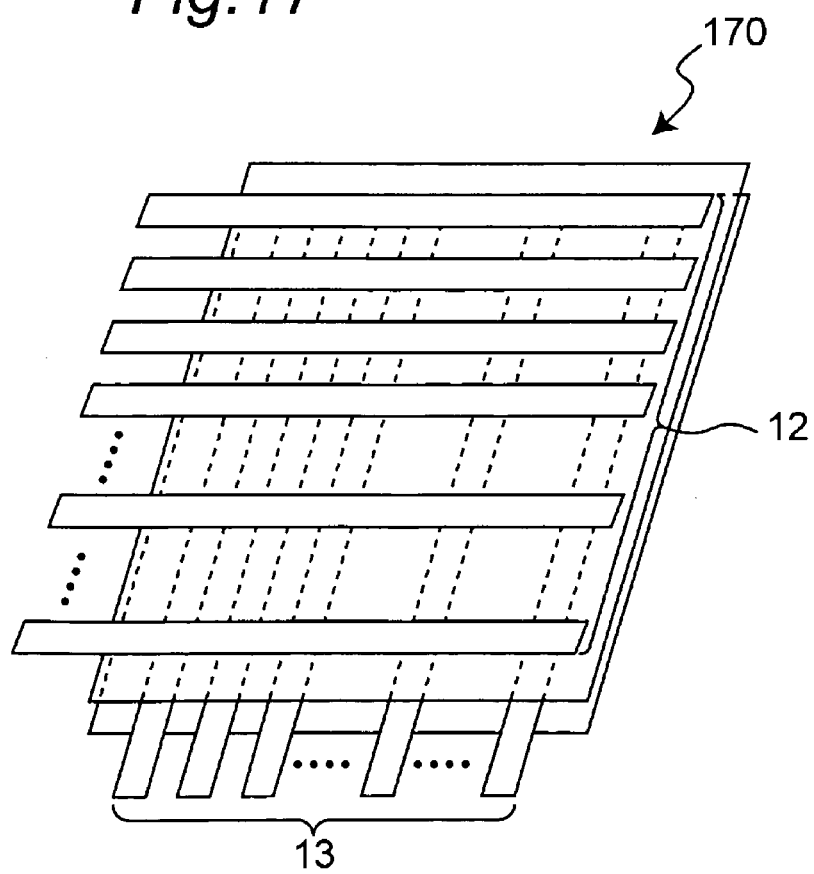
FIG. 17 is a schematic plan view showing a display device using a phosphor element according to a fourteenth embodiment of the present invention.
Figure 18:
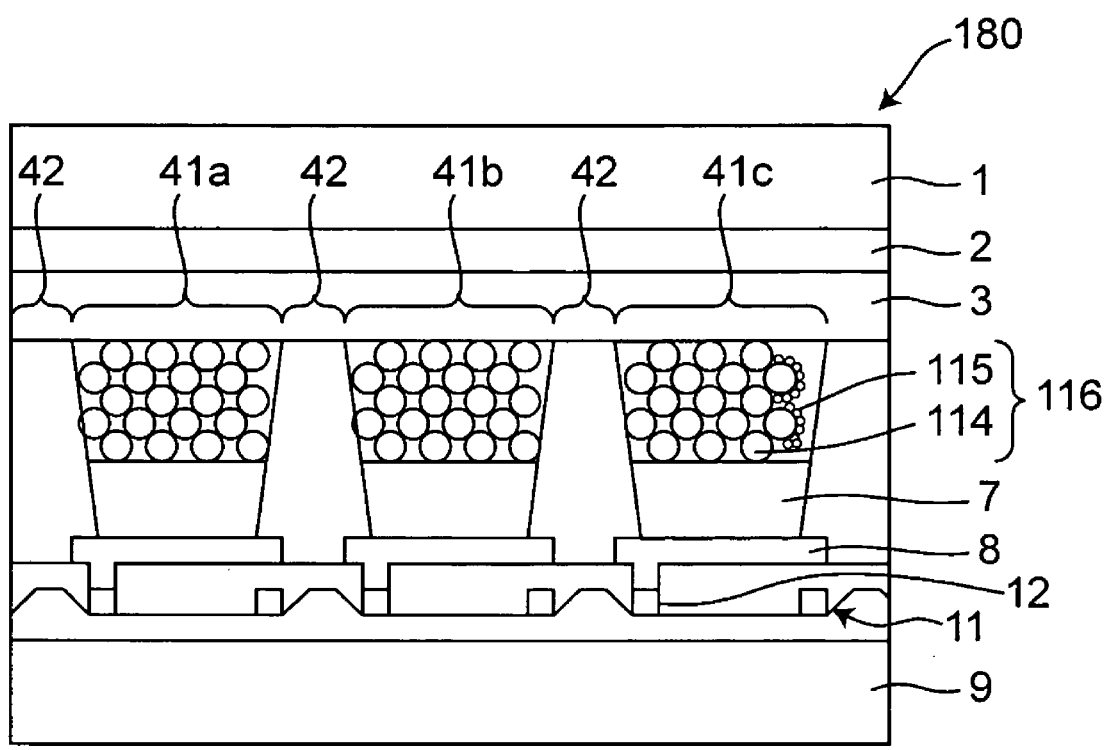
FIG. 18 is a sectional view showing a display device using the phosphor element and perpendicular to its emission surface according to the fourteenth embodiment of the present invention.

A display device according to a fourteenth embodiment of the present invention will be described with reference to FIG. 17. FIG. 17 is a schematic view showing an active matrix of the display device 170, which is constituted by x electrodes 12 and y electrodes 13 intersecting with each other. The display device 170 is different from the display device 130 according to the eleventh embodiment in that the plurality of phosphor elements shown in FIG. 16 are arranged two dimensionally. In addition, since the other components are substantially the same, their description will be omitted.

Working Example 5

A working example 5 of the present invention will be described. Since the phosphor element has the same constitution as that of the phosphor element 150 according to the twelfth embodiment, a description of its constitution will be omitted. This phosphor element is different from the phosphor element according to the working example 3 in that the phosphor direction and the polarity of the driving power supply are reversed. Therefore, its manufacturing method is different from that of the working example 3.

Next, the manufacturing method of this phosphor element will be described with reference to FIG. 15. The phosphor element is manufactured according to the following steps.

(a) A glass substrate was prepared as a substrate 9 and it was cleaned similar to the glass substrate having the ITO film according to the working example 3.

(b) Then, MgAg was stacked on the substrate 9 by the vacuum evaporation method to form an electron injection electrode 8. The film thickness was 300 nm.

(c) CN-PPV was stacked on the electron injection electrode 8 by the vacuum evaporation method to form an electron transport layer 7. The film thickness thereof was 50 nm.

(d) Then, the inorganic phosphor particle 114 to which the conductive organic material 115 was chemically adsorbed was diffused in ethanol using ultrasound and applied to the electron hole transport layer 7 by the spin coat method to form the phosphor layer 116. The film thickness thereof was 150 nm. Thus, a substrate O was provided. Since a manufacturing method of the inorganic phosphor particle 114 to which the conductive organic material 115 is chemically adsorbed is the same as that of the working example 3, its description will be omitted.

(e) Then, as a transparent substrate 1 on which an electron hole injection electrode 2 was formed, a commercially available glass substrate having an ITO film was prepared and cleaned similar to the working example 3.

(f) Then, PEDOT was dissolved with chloroform and applied to the electron hole injection electrode 2 by the spin coat method to form the electron hole transport layer 3. The film thickness thereof was 100 nm. Thus, a substrate P was provided.

(g) Then, immediately after the electron hole transport layer 3 was formed, the phosphor layer 116 of the substrate O of the substrate 9 was put on the electron hole transport layer 3 of the transparent substrate 1 of the substrate P so that the substrate O and the substrate P were bonded. Thus, the phosphor element 150 was provided.

When a DC voltage was applied to the phosphor element manufactured as described above, emission luminance was 380 cd/m$^2$ at 16V. This was the same as that of the working example 3.

In addition, although a three-layer constitution was illustrated in the above description, three or more layers may be provided for the layer containing the organic material.

In addition, in the phosphor elements according to the fourth to ninth embodiments, an electron hole injection layer and/or a conductive layer may be provided between the electron hole injection electrode 2 and the electron hole transport layer 3 similar to the phosphor element according to the first embodiment, for example. In addition, an electron hole block layer and/or a conductive layer and the like may be provided between the inorganic phosphor layer 4 or the phosphor layer 116 and the electron transport layer 7, for example. Still furthermore, an electron injection layer and/or a conductive layer and the like may be provided between the electron transport layer 7 and the electron injection electrode 8, for example. In addition, although a luminescent color is determined by the inorganic phosphor layer 4 or the inorganic phosphor particles 114, in order to display multiple colors or white color, or to adjust color purity of each color, a color conversion layer may be provided ahead of the phosphor direction of the inorganic phosphor layer 4 or the phosphor layer 116, or a color conversion material may be mixed in the transparent conductive matrix of the electron hole transport layer 3 or the electron transport layer 7, the electron hole injection layer, the electron injection layer, the electron hole block layer, or the phosphor layer 116 provided ahead of the phosphor direction of the inorganic phosphor layer 4 or the phosphor layer 116. Since the color conversion layer and the color conversion material may only have to emit light as an excitation source, it may be an organic material or an inorganic material, so that a well-known fluorescent substance, a pigment, a dye can be used. For example, when the emission from the inorganic phosphor layer 4 or the phosphor layer 116 and the emission from the color conversion layer or the color conversion material which is in complementary color relation are mixed, a surface light source which emits white light can be provided.

Furthermore, in the phosphor elements according to the fourth, fifth and eleventh embodiments, similar to the phosphor element according to the first embodiment, when the electron injection electrode 8 is made transparent or semi-transparent, an upper surface emission type or a both-surface emission type of phosphor element can be provided according to another example.

Still furthermore, in the display device according to the eleventh and fourteenth embodiments, similar to the display device according to the third embodiment, a color filter may be provided in the phosphor direction in order to adjust the color purity of each color of RGB. Furthermore, the inorganic phosphor which emits one color may be used in every pixel 41, and a color conversion layer and the color filter may be further provided ahead of the phosphor direction. Thus, for example, when the color conversion layer absorbs blue light generated from the inorganic phosphor particle 114, green or red light is generated and when they are taken out respectively, there can be provided a full-color display device using the three primary colors according to another example.

As described above, although the present invention has been described in detail with reference to the preferred embodiments, the present invention is not limited to the embodiments, and as will be understood by those skilled in the art, many preferred variations and modifications can be made within a technical scope of the present invention described in the following claims.

The invention claimed is:

1. A phosphor element comprising:
an electron hole injection electrode and an electron injection electrode disposed opposite to each other;
a stacked layer of an electron hole transport layer, a phosphor layer, and an electron transport layer stacked in this order, said stacked layer being sandwiched between the electron hole injection electrode and the electron injection electrode with the electron hole transporting layer located close to the electron hole injection electrode, wherein:
the phosphor layer includes an inorganic phosphor layer, wherein a conductive organic material having at least one of an electron hole transporting property and electron transporting property is chemically adsorbed to at least one part of the surface of the inorganic phosphor layer,
the inorganic phosphor layer includes a phosphor material having an oxide or composite oxide as a host containing one or more elements selected from Ga, Sn and Ti, wherein a metal element is doped as an activator agent and serves as a center of the emission.

2. The phosphor element according to claim 1, wherein:
a conductive organic material having an electron hole transporting property is chemically adsorbed to the surface of the inorganic phosphor layer disposed opposite to the electron hole transport layer, and
a conductive organic material having an electron transporting property is chemically adsorbed to the surface of the inorganic phosphor layer disposed opposite to the electron transport layer.

3. A phosphor element comprising:
an electron hole injection electrode and an electron injection electrode disposed opposite to each other;
a stacked layer of an electron hole transport layer, a phosphor layer, and an electron transport layer stacked in this order, said stacked layer being sandwiched between the electron hole injection electrode and the electron injection electrode with the electron hole transporting layer located close to the electron hole injection electrode, and wherein:
the phosphor layer includes an inorganic phosphor particle, wherein a conductive organic material having at least one of an electron hole transporting property and electron transporting property is chemically adsorbed to at least one part of the surface of the inorganic phosphor particle, and
the inorganic phosphor particle includes a phosphor material having an oxide or composite oxide as a host containing one or more elements selected from Ga, Sn and Ti, wherein a metal element is doped as an activator agent and serves as a center of the emission.

* * * * *